(12) United States Patent
Wu et al.

(10) Patent No.: US 11,750,261 B2
(45) Date of Patent: Sep. 5, 2023

(54) ANALOG BEAMFORMER USED FOR ARRAY ANTENNA AND OPERATING METHOD THEREOF

(71) Applicant: Industrial Technology Research Institute, Hsinchu (TW)

(72) Inventors: Janne-Wha Wu, Chiayi (TW); Tang-Yu Lee, New Taipei (TW); Ming Jie Yu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 139 days.

(21) Appl. No.: 17/545,983

(22) Filed: Dec. 8, 2021

(65) Prior Publication Data
US 2023/0123851 A1    Apr. 20, 2023

(30) Foreign Application Priority Data

Oct. 14, 2021   (TW) ................. 110138217

(51) Int. Cl.
*H04B 1/04*      (2006.01)
*H04B 7/06*      (2006.01)
(Continued)

(52) U.S. Cl.
CPC ............ *H04B 7/0682* (2013.01); *H03F 3/19* (2013.01); *H04B 1/04* (2013.01); *H03F 2200/451* (2013.01); *H04B 7/0617* (2013.01)

(58) Field of Classification Search
None
See application file for complete search history.

(56) References Cited

U.S. PATENT DOCUMENTS 7,280,848 B2    10/2007   Hoppenstein
7,940,830 B2 *   5/2011   Marsili ............... H04B 1/7136
                                                    331/46
(Continued)

FOREIGN PATENT DOCUMENTS

AU     2019200602       7/2019
CN     111983556       11/2020
(Continued)

OTHER PUBLICATIONS

K. Stephan et al., "Analysis of interinjection-locked oscillators for integrated phased arrays," IEEE Transactions on Antennas and Propagation, vol. 35, Jul. 1987, pp. 771-781.
(Continued)

*Primary Examiner* — Pablo N Tran
(74) *Attorney, Agent, or Firm* — JCIPRNET

(57) ABSTRACT

An analog beamformer used for array antenna and an operating method thereof are provided. The analog beamformer used for array antenna includes an intermediate-frequency amplifying circuit, multiple local oscillators, multiple mixers, multiple radio-frequency amplifying circuits, and a frequency locking circuit. The analog beamformer uses a master-oscillator and multiple slave-oscillators which embed a resonant network of frequency-and-phase-locking. The intermediate-frequency amplifying circuit receives a baseband signal to provide an intermediate-frequency signal. Power supplies or grounding ports of different local oscillators are connected together to provide multiple local-oscillating signals with consistent frequency but different phases. The mixers individually receive the intermediate-frequency signal and one of the local-oscillating signals to provide multiple mixed signals. The radio-frequency amplifying circuits receive the mixed signals to provide multiple radio-frequency signals with consistent frequency but dif-
(Continued)

ferent phases to each antenna. The frequency locking circuit only locks a frequency of one of the local-oscillating signals.

21 Claims, 17 Drawing Sheets

(51) Int. Cl.
  *H03F 3/19* (2006.01)
  *H03L 7/08* (2006.01)
  *H03L 7/197* (2006.01)
  *H04B 1/06* (2006.01)
  *H03B 27/00* (2006.01)

(56) References Cited

U.S. PATENT DOCUMENTS

| | | | |
|---|---|---|---|
| 8,183,935 | B2 | 5/2012 | Milano et al. |
| 8,537,051 | B1 | 9/2013 | Rudish |
| 9,445,282 | B2 | 9/2016 | Chen et al. |
| 9,490,548 | B2 | 11/2016 | Weissman et al. |
| 9,705,516 | B1 * | 7/2017 | Fredenburg .......... H03B 5/1243 |
| 10,141,993 | B2 | 11/2018 | Lee et al. |
| 10,333,531 | B2 | 6/2019 | Wu |
| 10,498,029 | B1 | 12/2019 | Tran et al. |
| 10,659,065 | B2 * | 5/2020 | Mayer .................. H03L 7/093 |
| 11,018,436 | B2 | 5/2021 | Mahanfar et al. |
| 2008/0218429 | A1 | 9/2008 | Johnson et al. |
| 2009/0303573 | A1 | 12/2009 | Hillis et al. |
| 2010/0034316 | A1 * | 2/2010 | Korevaar ............ H04L 27/2332 375/308 |
| 2011/0291889 | A1 | 12/2011 | Mayo |
| 2014/0043103 | A1 * | 2/2014 | Taghivand ............ H03B 19/14 331/34 |
| 2014/0097986 | A1 | 4/2014 | Xue et al. |
| 2016/0080051 | A1 | 3/2016 | Sajadieh et al. |
| 2016/0261325 | A1 | 9/2016 | Ko et al. |
| 2020/0091608 | A1 | 3/2020 | Alpman et al. |
| 2020/0119742 | A1 | 4/2020 | Jain et al. |
| 2020/0204167 | A1 | 6/2020 | Chakraborty |

FOREIGN PATENT DOCUMENTS

| | | |
|---|---|---|
| TW | 201249121 | 12/2012 |
| TW | I664830 | 7/2019 |
| WO | 2016082887 | 6/2016 |
| WO | 2020132611 | 6/2020 |

OTHER PUBLICATIONS

Sheng-Hong Yan et al., "A Beam-Steering Antenna Array Using Injection Locked Coupled Oscillators With Self-Tuning of Oscillator Free-Running Frequencies," IEEE Transactions on Antennas and Propagation, vol. 56, Sep. 2008, pp. 2920-2928.
R.A. York et al., "Injection- and phase-locking techniques for beam control," IEEE Transactions on Microwave Theory and Techniques, vol. 46, Nov. 1998, pp. 1920-1929.
Qu Daxiong, "Research and Development of 38-GHz Wireless Key Component-Sub project 5: Development of local oscillator circuit(1/3)(2/3)(3/3)," Institute of Telecommunications Engineering, National Taiwan University, Oct. 2004, pp. 1-130.
K.D. Stephan et al., "Inter-Injection-Locked Oscillators for Power Combining and Phased Arrays," IEEE Transactions on Microwave Theory and Techniques, vol. 34, Oct. 1986, pp. 1017-1025.
P. Liao et al., "A New Phase-Shifteriess Beam-Scanning Technique Using Arrays of Coupled Oscillators," IEEE Transactions on Microwave Theory and Techniques, vol. 41, Oct. 1993, pp. 1810-1815.
A. Alexanian et al., "Enhanced scanning range of coupled oscillator arrays utilizing frequency multipliers," IEEE Antennas and Propagation Society International Symposium. 1995 Digest, Jun. 1995, pp. 1308-1310.
James F. Buckwalter et al., "An Integrated Subharmonic Coupled-Oscillator Scheme for a 60-GHz Phased-Array Transmitter," IEEE Transactions on Microwave Theory and Techniques, vol. 54, Dec. 2006, pp. 4271-4280.
Wei-Tsung Li et al., "60-GHz 5-bit Phase Shifter With Integrated VGA Phase-Error Compensation," IEEE Transactions on Microwave Theory and Techniques, vol. 61, Mar. 2013, pp. 1224-1235.
Suman P. Sah et al., "An ultra-wideband 15-35 GHz phase-shifter for beamforming applications," 2013 European Microwave Integrated Circuit Conference, Dec. 2013, pp. 264-267.
Robin Garg et al., "A 28-GHz Low-Power Phased-Array Receiver Front-End With 360° RTPS Phase Shift Range," IEEE Transactions on Microwave Theory and Techniques, vol. 65, Nov. 2017, pp. 4703-4714.
Png Gu et al., "Ka-Band CMOS 360° Reflective-Type Phase Shifter with ±0.2 dB Insertion Loss Variation Using Triple-Resonating Load and Dual-Voltage Control Techniques," 2018 IEEE Radio Frequency Integrated Circuits Symposium (RFIC), Jun. 2018, pp. 140-143.
J.-H. Tsai et al., "Low RMS phase error 28 GHz 5-bit switch type phase shifter for 5G applications," Electronics Letters, vol. 54, Oct. 2018, pp. 1184-1185.
Yu-Hsuan Lin et al., "A low phase and gain error passive phase shifter in 90 nm CMOS for 60 GHz phase array system application," 2016 IEEE MTT-S International Microwave Symposium (IMS), May 2016, pp. 1-4.
Zyad Iskandar et al., "A 30-50 GHz reflection-type phase shifter based on slow-wave coupled lines in BiCMOS 55 nm technology," 2016 46th European Microwave Conference (EuMC), Oct. 2016, pp. 1413-1416.
Yahya Tousi et al., "A Ka-band digitally-controlled phase shifter with sub-degree phase precision," 2016 IEEE Radio Frequency Integrated Circuits Symposium (RFIC), May 2016, pp. 356-359.
Jen-Chieh Wu et al., "A 24-GHz full-360° CMOS reflection-type phase shifter MMIC with low loss-variation," 2008 IEEE Radio Frequency Integrated Circuits Symposium, Jun. 2008, pp. 365-368.
Hamed Alsuraisry et al., "A X-band digitally controlled 5-bit phase shifter in 0.18-µm CMOS technology," 2015 Asia-Pacific Microwave Conference (APMC), Dec. 2015, pp. 1-3.
Chung-Han Wu et al., "Design of a K-band low insertion loss variation phase shifter using 0.18-µm CMOS process," 2010 Asia-Pacific Microwave Conference, Dec. 2010, pp. 1-4.
Yu-Teng Chang et al., "A 28-GHz Low-Power Vector-Sum Phase Shifter Using Biphase Modulator and Current Reused Technique," IEEE Microwave and Wireless Components Letters, vol. 28, Nov. 2018, pp. 1014-1016.
Xuan Luo et al., "A Low-Profile 36-Element K-Band Active Phased Array for Ultra-Small Aperture Application," IEEE Access, vol. 8, Mar. 2020, pp. 62286-62297.
Feifei Gao et al., "Wideband Beamforming for Hybrid Massive MIMO Terahertz Communications," IEEE Journal on Selected Areas in Communications, vol. 39, Jun. 2021, pp. 1725-1740.
Jian Pang et al., "A CMOS Dual-Polarized Phased-Array Beamformer Utilizing Cross-Polarization Leakage Cancellation for 5G MIMO Systems," IEEE Journal of Solid-State Circuits, vol. 56, Apr. 2021, pp. 1310-1326.
Hamid Ali Mirza et al., "Hardware implementation of analog beamformer for Phased Array Radar (PAR)," Proceedings of 2012 9th International Bhurban Conference on Applied Sciences & Technology (IBCAST), Jan. 2012, pp. 403-406.
Vahnood Pourahmad et al., "A System of Two Coupled Oscillators With a Continuously Controllable Phase Shift", IEEE Transactions on Circuits and Systems I: Regular Papers, Apr. 1, 2019, pp. 1531-1543.
"Search Report of Europe Counterpart Application", dated Jun. 14, 2022, p. 1-p. 8.
"Office Action of Taiwan Counterpart Application", dated Feb. 22, 2022, p. 1-p. 7.

* cited by examiner

ANALOG BEAMFORMER USED FOR ARRAY ANTENNA AND OPERATING METHOD THEREOF

CROSS-REFERENCE TO RELATED APPLICATION

This application claims the priority benefit of Taiwan application serial no. 110138217, filed on Oct. 14, 2021. The entirety of the above-mentioned patent application is hereby incorporated by reference herein and made a part of this specification.

BACKGROUND

Technical Field

The disclosure relates to a beamformer, and particularly relates to an analog beamformer used for array antenna and an operating method thereof.

Description of Related Art

The beamformer is an important circuit for providing directional emission of electromagnetic energy. Radars for military purposes have been widely used and have also recently expanded the use in mobile communications. The directional emission is necessary especially above the millimeter waveband, and the beamformer has become a key technology for short-wavelength mobile communications.

FIG. 1A to FIG. 1D are schematic views of systems of architectures of various conventional beamformers used for array antenna. A digital signal processor (DSP) and a digital to analog converter (DAC) are used to generate analog signals to be transmitted by antennas $ANT_1$ to $ANT_n$. As shown in FIG. 1A to FIG. 1D, the architecture of the beamformer used for array antenna includes several phase shifters (such as PST1, PST2, PST3, or PST4). The disadvantage of using a phase shifter is that the signal loss of the phase shifter increases as frequency increases. For the operating frequency bands beyond millimeter wave, the signal loss of phase shifter may reach 5 to 6 dB. In the architecture of the beamformer used for array antenna shown in FIG. 1A, the phase of the fed signal before into the phase shifter is greatly affected by the difference in lengths of feeding paths and the phase variations become more severe as in a higher operating frequency. In the architecture of the beamformer used for array antenna shown in FIG. 1B to FIG. 1D, multiple sets of mixers are added. In the architecture of the beamformer used for array antenna shown in FIG. 1B, before allocating local-oscillating signals to different mixers, the additions of amplifiers are necessary to provide the required power for the local-oscillating ends of the mixers. Also, in the architecture of the beamformer used for array antenna using the phase shifter, as it is implemented as an integrated circuit by a semiconductor process, the length of a transmission line and the addition of an inductor will occupy a lot of chip area and take more cost.

SUMMARY

The disclosure provides an analog beamformer used for array antenna without a phase shifter and an operating method thereof, which can avoid power loss issues of signals flowing through the phase shifter, and can effectively avoid the problems of the amplitude error and the phase error suffering from the usage of phase shifter so as to minimize the estimation error of reference symbol received power (RSRP). The disclosure is also conducive to realize the feeding path layout of millimeter-wave beamforming circuit.

An analog beamformer used for array antenna of the disclosure includes an intermediate-frequency amplifying circuit, multiple local oscillators, multiple mixers, multiple radio-frequency amplifying circuits, and a frequency locking circuit. The intermediate-frequency amplifying circuit receives a baseband signal to provide an intermediate-frequency signal. Power supplies or grounding ports of several local oscillators are connected together to generate frequency synchronization. At the same time, a phase difference is formed, and multiple local-oscillating signals with consistent frequency but different phases are provided. The local oscillators are under the control of different oscillating-frequency-control signal, respectively. The mixers individually receive the intermediate-frequency signal and one of the local oscillating signals, and the mixers provide multiple mixed signals. Several radio-frequency amplifying circuits receive the mixed signals to provide multiple radio-frequency signals with consistent frequency but different phases to different antennas. The radio-frequency signals received by each antenna have consistent frequency but different phases, so as to form directional radio-frequency signal transmission or reception. The frequency locking circuit is only coupled to one of the local oscillators and then lock in the frequency of the coupled local oscillator.

An operating method of an analog beamformer used for array antenna of the disclosure includes at least the following steps. A baseband signal is amplified by an intermediate-frequency amplifying circuit to generate an intermediate-frequency signal. Multiple local-oscillating signals are provided by multiple local oscillators. Free-running frequencies of multiple local oscillators are under the controls of different oscillating-frequency-control signals. Power supplies or grounding ports of multiple local oscillators are connected together. After the DC power supply nodes or the grounding ports are connected, the frequencies of the local-oscillating signals from the local oscillators are kept the same as and consistent with that of one local oscillator which is coupled with and connected with the frequency locking circuit, but different from the original free-running frequencies. All of the local oscillators tend to be consistent with the same frequency and deviate from the original free running frequencies, but there is a phase difference between the local-oscillating signals of the local oscillators. As one of the local oscillators followed by the other local oscillators, its oscillating-frequency thereof is locked by a frequency locking circuit. Then, the intermediate-frequency signal and one of the local-oscillating signals are individually mixed by multiple mixers to generate one of multiple mixed signals. The mixed signals are amplified by multiple radio-frequency amplifying circuits to provide multiple radio-frequency signals with different phases to multiple antennas.

In the embodiments of the disclosure, for connection of the power supplies or the grounding ports between different local oscillators, the connection may be only implemented at the power supplies, the connection may be only implemented at the grounding ports, or the connection may be implemented at both of the power supplies and the grounding ports.

Based on the above, the analog beamformer used for array antenna and the operating method thereof according to the embodiments of the disclosure can achieve the same phase adjustment function as the phase shifter by the disclosed resonant network of frequency-and-phase-locking formed by connecting the power supplies or the grounding ports of the local oscillators. Since there is no shortcoming as caused as using the phase shifter, the signal transmission power loss of the phase shifter can be avoided, and the amplitude error and the phase error of the phase shifter can be effectively avoided, so as to avoid the estimation error of the reference symbol received power. Also, the design methodology of local oscillator is different from the phase shifter, the usage of transmission line and inductor is minimized, so the occupied circuit area is smaller. It is conducive to realize the feeding path layout of millimeter-wave beamforming integrated circuit.

In order for the features and advantages of the disclosure to be more comprehensible, the following specific embodiments are described in detail in conjunction with the accompanying drawings.

DETAILED DESCRIPTION OF DISCLOSED EMBODIMENTS

The disclosure is designed for a beamformer used in an array antenna system of a base station, a mobile terminal, and a radar. At present, there are issues of phase shifter loss, amplitude error, and phase error when implementing the beamforming function by analog technology. Moreover, the length of a feeder path before and after the phase shifter affects the phase of the final antenna radiation signal. In a higher frequency band such as millimeter wave and above, the routing arrangement of the feeder path before and after the phase shifter becomes more and more difficult, especially for the massive antenna array.

Compared with the prior art that are mostly implemented by injection locking or coupling network, the disclosure proposes a new analog beamforming architecture to be used used for array antenna without using phase shifter.

An analog beamformer of the disclosure used for array antenna not only reduces power loss, but also avoids the estimation error of reference symbol received power. This kind of analog beamformer topology will greatly present its superiority as the operating frequency becoming higher, e.g. millimeter wave. Moreover, for the array antenna system with a large number of antennas, the advantages of this method can be more apparent and conspicuous, especially in terms of layout routing.

Figure 1A:
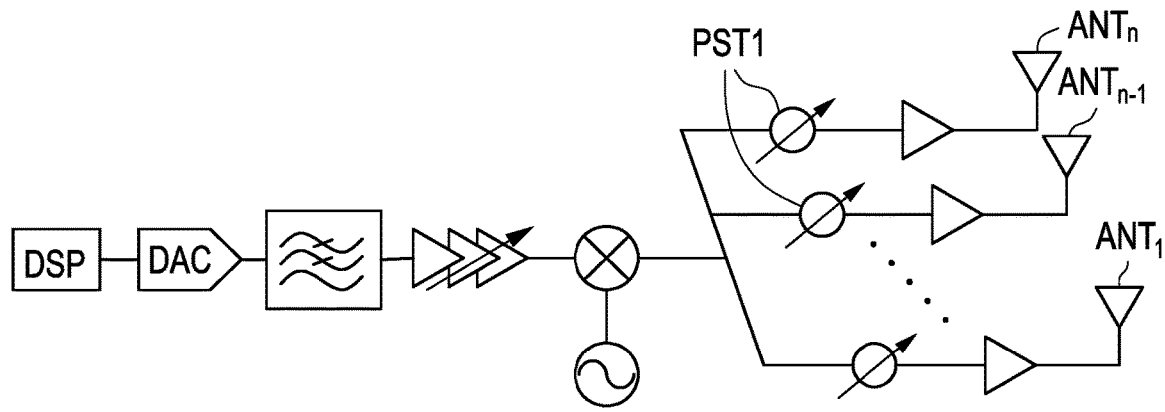
FIG. 1A to FIG. 1D are the architecture views of various conventional beamformers used for array antenna.
Figure 1B:
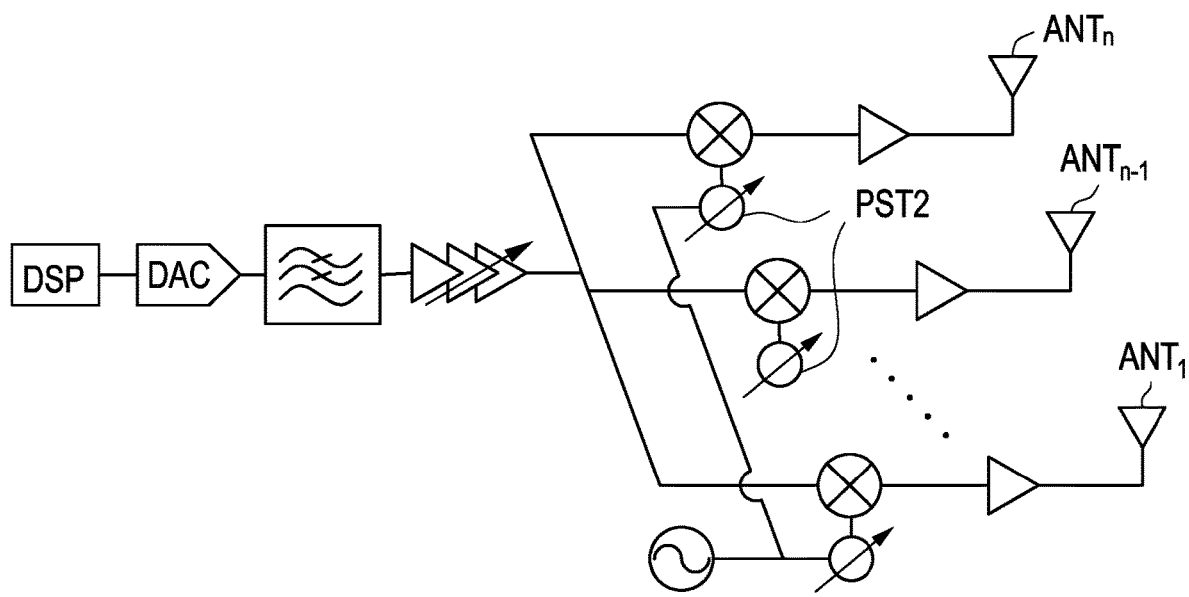
Figure 1C:
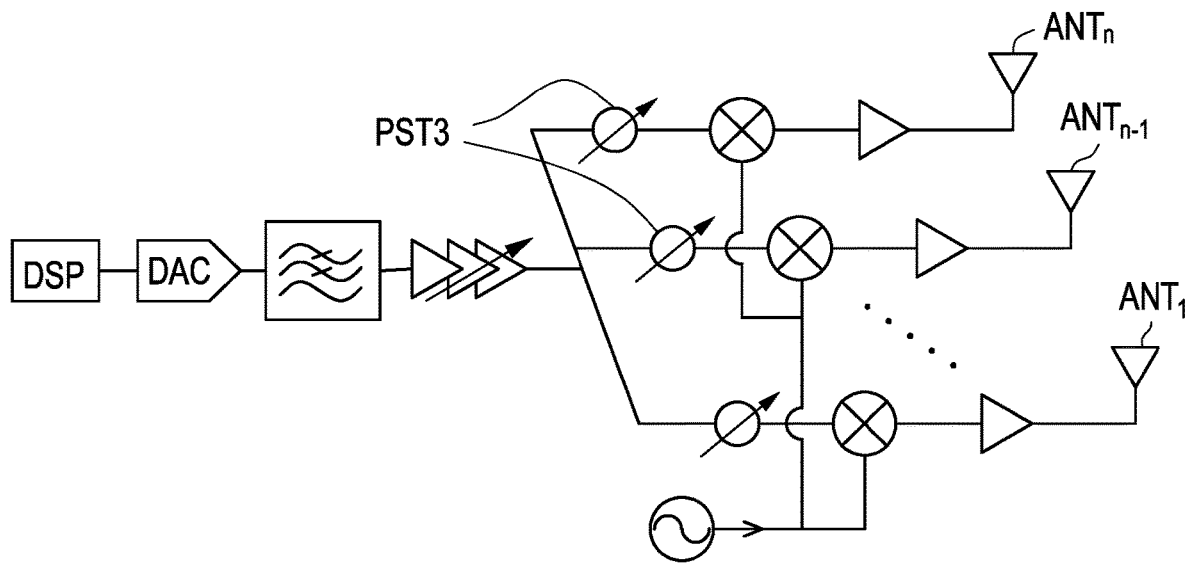
Figure 1D:
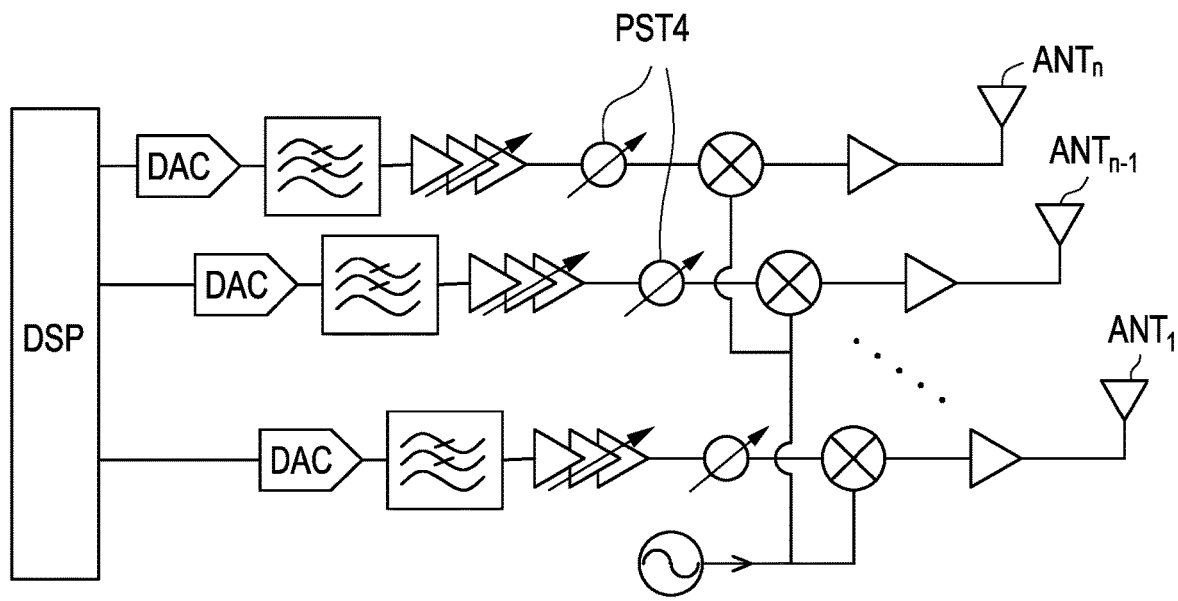
Figure 2:
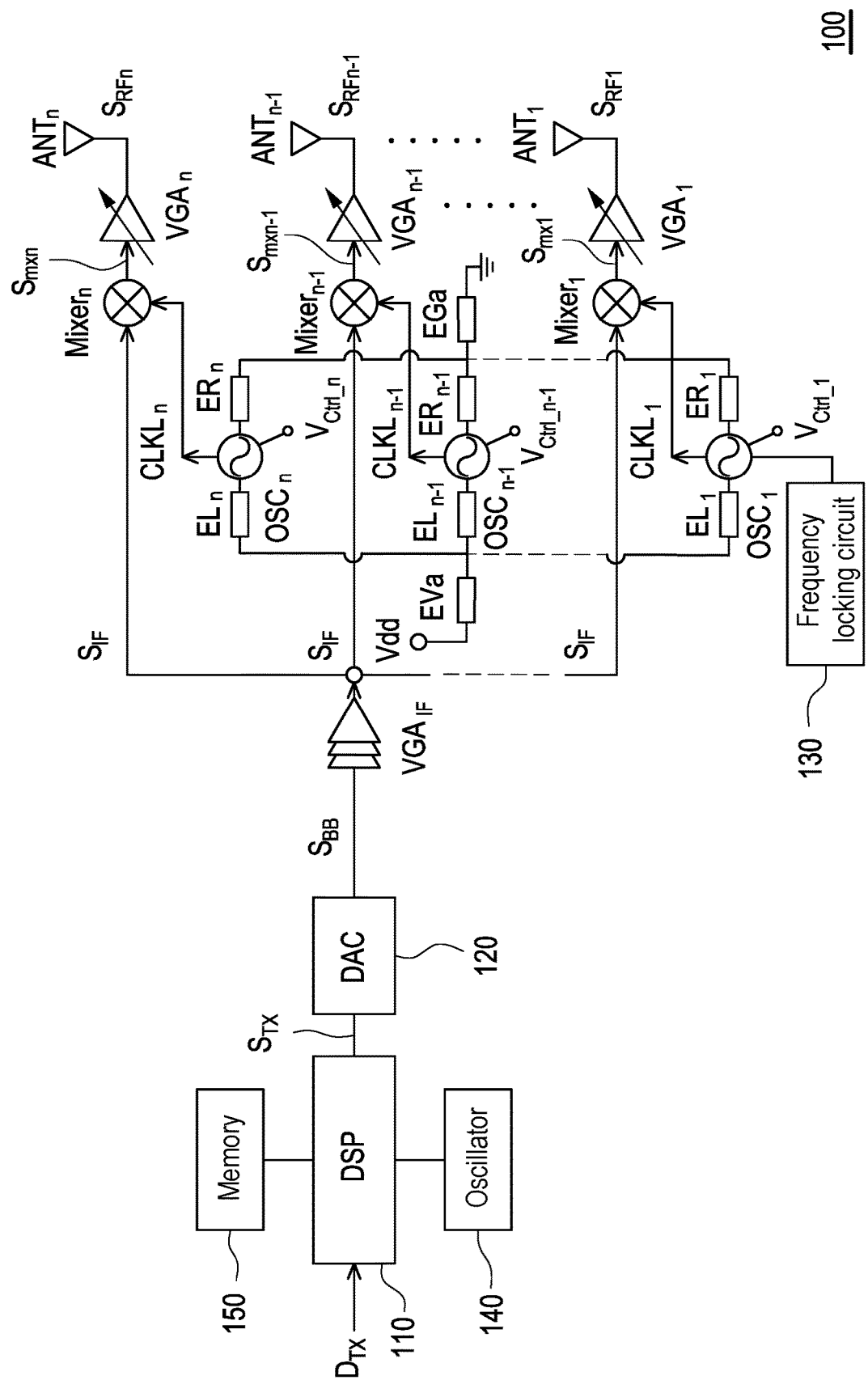
FIG. 2 is a schematic view of an analog beamformer used for array antenna in which connecting by elements is implemented at both power supply sides and grounding terminals according to an embodiment of the disclosure.

FIG. 2 is a schematic view of a system of an analog beamformer used for array antenna according to an embodiment of the disclosure. Please refer to FIG. 2. In the embodiment, an analog beamformer used for array antenna 100 includes a processor 110, a digital to analog converter 120, a frequency locking circuit 130, an intermediate-frequency amplifying circuit $VGA_{IF}$, multiple local oscillators $OSC_1$ to $OSC_n$, multiple first power-supply-elements $EL_1$ to $EL_n$, a second power-supply-element Eva, multiple first grounding-port-elements $ER_1$ to $ER_n$, a second grounding-port-element EGa, multiple radio-frequency amplifying circuits $VGA_1$ to $VGA_n$, multiple mixers $Mixer_1$ to $Mixer_n$, and multiple antennas $ANT_1$ to $ANT_n$, where n is a positive integer and is greater than or equal to 2. The processor 110 is, for example, a digital signal processor, and the intermediate-frequency amplifying circuit $VGA_{IF}$ and the radio-frequency amplifying circuits $VGA_1$ to $VGA_n$ are, for example, variable gain amplifiers.

The processor 110 receives data $D_{TX}$ to be transmitted to generate a signal $S_{TX}$ to be transmitted wherein the processor 110 is, for example, a digital signal processor. The digital to analog converter 120 connecting the processor 110 receives the signal $S_{TX}$ which is generated from the processor 110, and subsequently converts the signal $S_{TX}$ to be a baseband signal $S_{BB}$. The intermediate-frequency amplifying circuit $VGA_{IF}$ after the digital to analog converter 120 amplifies the baseband signal $S_{BB}$ and provides an intermediate-frequency signal $S_{IF}$.

The DC-bias nodes of local oscillators $OSC_1$ to $OSC_n$ can be connected by the first connecting elements $EL_1$ to $EL_n$, respectively, and afterwards connect together to the DC power supply Vdd via the second element Eva to form a resonant network of frequency-and-phase-locking. The grounding ports of local oscillators $OSC_1$ to $OSC_n$ can also connect the first connecting elements $ER_1$ to $ER_n$, respectively, and afterwards connect together to a external ground terminal via the second element EGa to form a resonant network of frequency-and-phase-locking. The local oscillators $OSC_1$ to $OSC_n$ provide multiple local oscillating-signals $CLKL_1$ to $CLKL_n$, wherein the local oscillators $OSC_1$ to $OSC_n$ are under the control of different oscillating-frequency-control signals $V_{Ctrl\_1}$ to $V_{Ctrl\_n}$ to setup the free-running frequencies thereof. The frequency locking circuit 130 is coupled to one of the local oscillators, for instance $OSC_1$, to lock the frequency of the local oscillating-signal $CLKL_1$ of the local oscillator $OSC_1$, wherein the local oscillator $OSC_1$ connected to the frequency locking circuit 130 may be regarded as a master oscillator, and the local oscillators $OSC_2$ to $OSC_n$ may be regarded as slave oscillators whose oscillation frequencies will follow up the oscillating-frequency of the master oscillator (such as the local oscillator $OSC_1$) and then deviate from its original free-running-frequency. The master oscillator controls the oscillation frequencies of the slave oscillators, and the phases of the local oscillating-signals of the slave oscillators become dependent on the oscillating-frequency-control signals $V_{Ctrl\_1}$ to $V_{Ctrl\_n}$.

The mixers $Mixer_1$ to $Mixer_n$ are commonly coupled to the intermediate-frequency amplifying circuit $VGA_{IF}$ to simultaneously receive the intermediate-frequency signal $S_{IF}$ and individually mix with one of the local oscillating-signals $CLKL_1$ to $CLKL_n$ in the same frequency but different phase. Therefore, the mixers $Mixer_1$ to $Mixer_n$ can individually provide mixed signals (such as $S_{mx1}$ to $S_{mxn}$) with different phases based on the received intermediate-frequency signal $S_{IF}$ and the received local oscillating-signals (such as $CLKL_1$ to $CLKL_n$) with different phases.

The radio-frequency amplifying circuits $VGA_1$ to $VGA_n$ after the mixers $Mixer_1$ to $Mixer_n$ will amplify one of the mixed signals $Smx_1$ to $Smx_n$ into radio-frequency signal (such as $S_{RF1}$ to $S_{RFn}$) with different phase based on the received mixed signals (such as $Smx_1$ to $Smx_n$). The antennas $ANT_1$ to $ANT_n$ receive the radio-frequency signals $S_{RF1}$ to $S_{RFn}$. According to the above, grounding ports of the local oscillators $OSC_1$ to $OSC_n$ are connected together to form a resonant network. It also applies to the DC-bias nodes to form a resonant network. Therefore, the frequencies of the local oscillating-signals $CLKL_1$ to $CLKL_n$ are synchronized to be the same frequency due to the existence of the resonant network. Different oscillating-frequency-control signals $V_{Ctrl\_1}$ to $V_{Ctrl\_n}$ will create different free-running frequencies for the local oscillating-signals $CLKL_1$ to $CLKL_n$. Once the frequencies of slave oscillators are forced to be the same as the frequency of master oscillator, phase differences happen between the local oscillators $OSC_1$ to $OSC_n$. This phenomenon is similar to the functionality of the phase shifter after the frequencies are coherent. Since the phase shifting of the signals is achieved through the coherent local oscillators $OSC_1$ to $OSC_n$, there is no drawback due to the use of the phase shifter, in which takes significant power loss and embeds with some amplitude/phase error. Therefore, this way can minimize the estimation error of the reference symbol received power. Moreover, the circuits topology of the local oscillators $OSC_1$ to $OSC_n$, unlike the phase shifter, as implemented in semiconductor integrated-circuit technology, it will occupy fewer area and becomes more attractive for the case of millimeter-wave beamformer.

In the embodiment of the disclosure, the DC-bias nodes of local oscillators $OSC_1$ to $OSC_n$ are coupled to a power supply voltage Vdd by a network of the first power supply elements $EL_1$ to $EL_n$ and the second power-supply-element Eva. Or, the grounding ports of local oscillators $OSC_1$ to $OSC_n$ are coupled to an external ground terminal by the first grounding port elements $ER_1$ to $ER_n$ and the second grounding-port-element EGa. Furthermore, the second power supply element EVa has one end tied to the power supply voltage Vdd, and the first power-supply-elements $EL_1$ to $EL_n$ are individually connected between the corresponding DC-bias nodes of the local oscillators $OSC_1$ to $OSC_n$ and another end of the second power-supply-element EVa. The second grounding-port-element EGa has one end coupled to the external grounding terminal, and the first grounding-port-elements $ER_1$ to $ER_n$ are individually connected between the corresponding grounding ports of the local oscillators $OSC_1$ to $OSC_n$ and another end of the second grounding-port-element EGa.

In the embodiment of the disclosure, the second power-supply-element EVa, the first power-supply-elements $EL_1$ to $EL_n$, the second grounding-port-element EGa, and the first grounding-port-elements $ER_1$ to $ER_n$ individually include one of a resistor, an inductor, a capacitor, a microstrip, a coaxial cable, and a waveguide, which are determined by the frequencies of the radio-frequency signals $S_{RF1}$ to $S_{RFn}$.

In the embodiment of the disclosure, the frequency locking circuit 130 is only coupled to the local oscillator $OSC_1$, but in other embodiments, the frequency locking circuit 130 may be only coupled to one of the local oscillators $OSC_2$ to $OSC_n$, which may be determined according to the feasibility of circuit layout, and the embodiment of the disclosure is not limited thereto.

In the embodiment of the disclosure, the analog beamformer used for array antenna 100 further includes a low-frequency quartz oscillator 140 and a memory 150 coupled to the processor 110. The low-frequency quartz oscillator 140 provides a reference clock signal required for the operation of the processor 110, and the memory 150 stores data to be processed (such as the data to be transmitted $D_{TX}$) by the processor 110.

Figure 3:
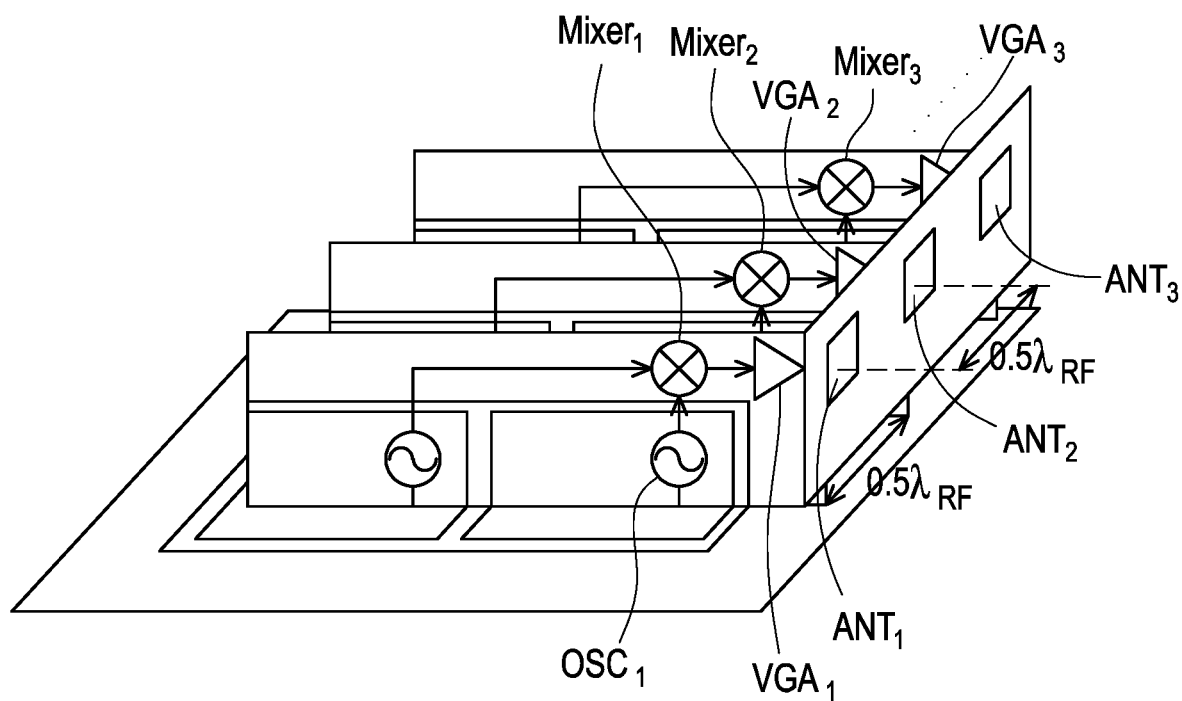
FIG. 3 illustrates the assembly of beamformer boards and antennas with embedding a connection between the ground ports of multiple local oscillators in the beamformer according to the embodiment of the disclosure.

FIG. 3 illustrates the assembly of beamformer boards and antennas with embedding a connection between the grounding ports of multiple local oscillators in the beamformer according to the embodiment of the disclosure. Please refer to FIG. 2 and FIG. 3. In the embodiment, each beamformer circuit board may be regarded as a single radio-frequency channel, which is at least configured with the corresponding local oscillator (such as $OSC_1$ to $OSC_n$), the corresponding mixer (such as $Mixer_1$ to $Mixer_n$), and the corresponding radio-frequency amplifying circuit (such as $VGA_1$ to $VGA_n$). Each beamformer circuit board contacts the corresponding antenna (such as $ANT_1$ to $ANT_n$).

In the embodiment, the spacing between the beamformer circuit boards may be $0.5\lambda_{RF}$, that is, ½ of the wavelength of the radio-frequency signal (such as $S_{RF1}$ to $S_{RFn}$), and the spacing between center points of electrodes of the antennas (such as $ANT_1$ to $ANT_n$) may also be $0.5\lambda_{RF}$.

Figure 4A:
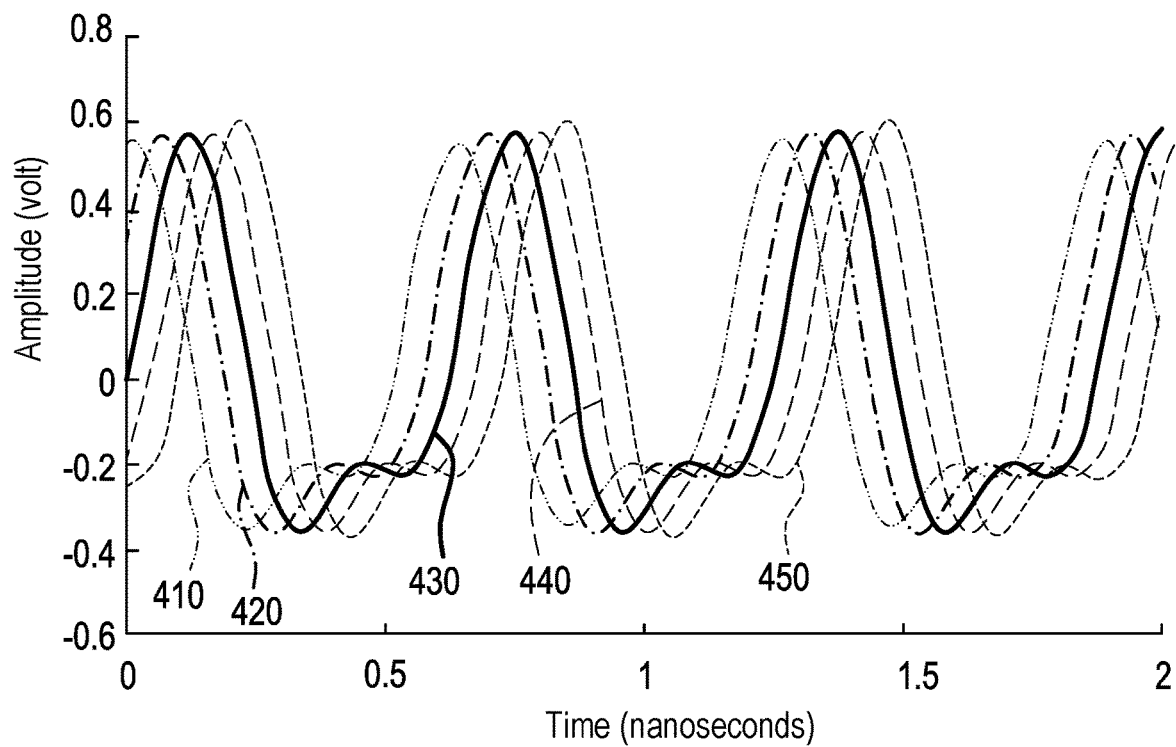
FIG. 4A is a time-domain view showing the phase difference between waveforms generated by analog beamformers used for array antenna according to an embodiment of the disclosure.

FIG. 4A is a time-domain view and shows the phase difference between the waveforms generated by analog beamformers used for array antenna according to an embodiment of the disclosure. Please refer to FIG. 1 and FIG. 4A. In the embodiment, the frequencies of the local oscillating-signals $CLKL_1$ to $CLKL_n$ are determined by the frequency of the local oscillating-signal (such as $CLKL_1$) of the master oscillator, and output phases of the local-oscillating signals (such as $CLKL_1$ to $CLKL_n$) of the slave oscillators are determined by the voltage levels of the received oscillating-frequency control signals (such as $V_{Ctrl\_1}$ to $V_{Ctrl\_n}$). As shown by curves 410, 420, 430, 440, and 450 in FIG. 4A, the adjustments of the voltage levels of the oscillating-frequency-control signals (such as $V_{Ctrl\_1}$ to $V_{Ctrl\_n}$) of the slave oscillators affect the output phases of the local-oscillating signals (such as $C_{LKL1}$ to $C_{LKLn}$). The selection of the main oscillator is not limited to the local oscillator $OSC_1$, but may also be one of the other local oscillators $OSC_2$ to $OSC_n$, which is determined according to feasible considerations of circuit layout. One of the local oscillator (such as the local oscillators $OSC_1$ to $OSC_n$) coupled with the frequency locking circuit 130 becomes the master oscillator, and the rest are slave oscillators.

Figure 4B:
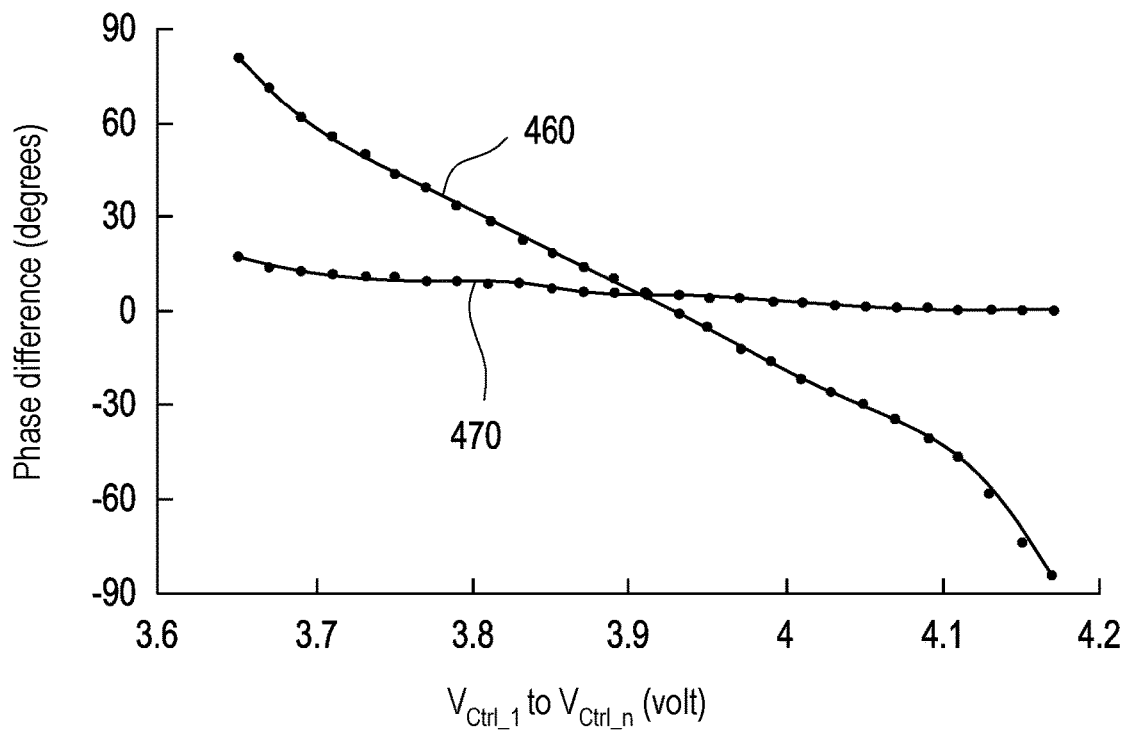
FIG. 4B shows the phase variation situation when an oscillating-frequency-control signal being applied to a local oscillator of the analog beamformer used for array antenna according to the embodiment of the disclosure. In the meantime, the oscillating-frequency-control signals of other local oscillators are kept unchanged and their phase characteristics are almost no change.

FIG. 4B shows the phase difference variation situation of other local oscillators with voltage levels of oscillating-frequency-control signals unchanged when a voltage level of an oscillating-frequency-control signal (such as $V_{Ctrl\_2}$) of one of multiple slave oscillators of the analog beamformer used for array antenna is adjusted according to an embodiment of the disclosure. Please refer to FIG. 1, FIG. 4A, and FIG. 4B. In the embodiment, the overall frequencies of the local-oscillating signals $CLKL_1$ to $CLKL_n$ are determined by the frequency of the local-oscillating signal (such as $CLKL_1$) of the master oscillator, and the output phases of the local-oscillating signals (such as $CLKL_2$ to $CLKL_n$) of the slave oscillators are determined by the voltage levels of the received oscillating-frequency-control signals (such as $V_{Ctrl\_2}$ to $V_{Ctrl\_n}$). As shown by curves 460 and 470 in FIG. 4B, the voltage levels of the oscillating-frequency-control signals (such as $V_{Ctrl\_2}$ to $V_{Ctrl\_n}$) of the slave oscillators can be used as adjustment (as shown by the curve 460 in FIG. 4B) of the output phase of the output clock signal (such as $CLKL_1$ to $CLKL_n$), but have minor impact (as shown by the curve 470 in FIG. 4B) on the output phases of the oscillating-signals (such as $CLKL_1$ to $CLKL_n$) by other slave oscillators.

Figure 5A:
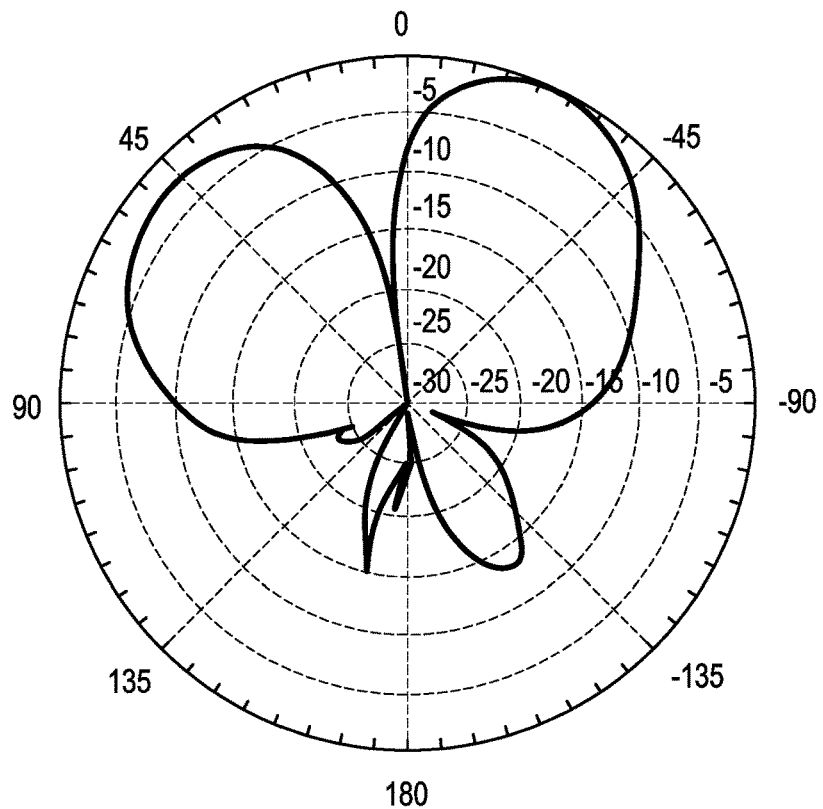
FIG. 5A to FIG. 5C depict the antenna gain-patterns of an analog beamformer used for array antenna at different output phase differences according to an embodiment of the disclosure.
Figure 5B:
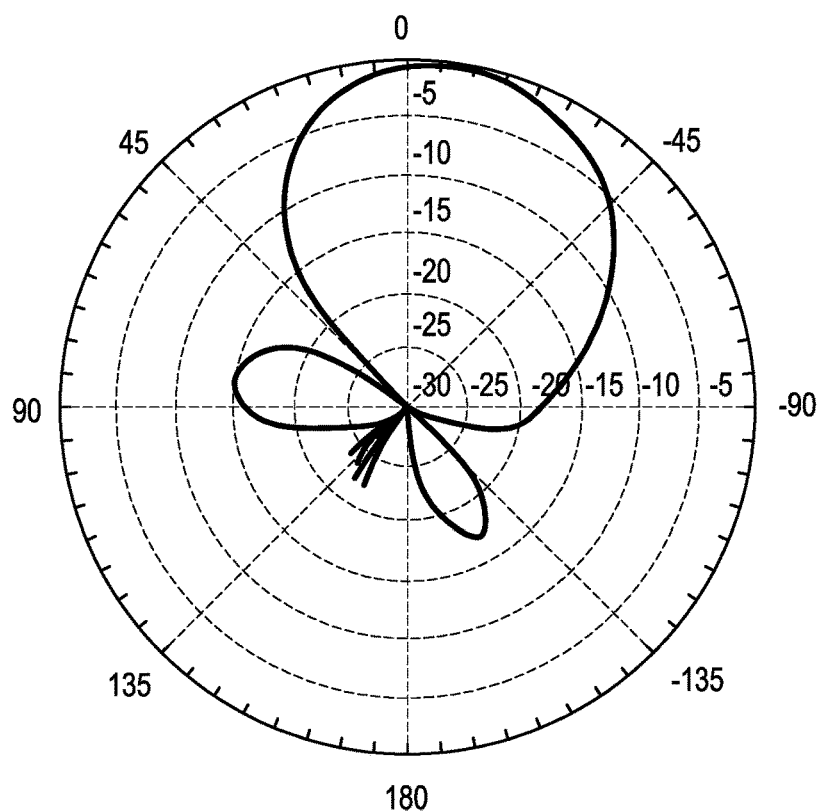
Figure 5C:
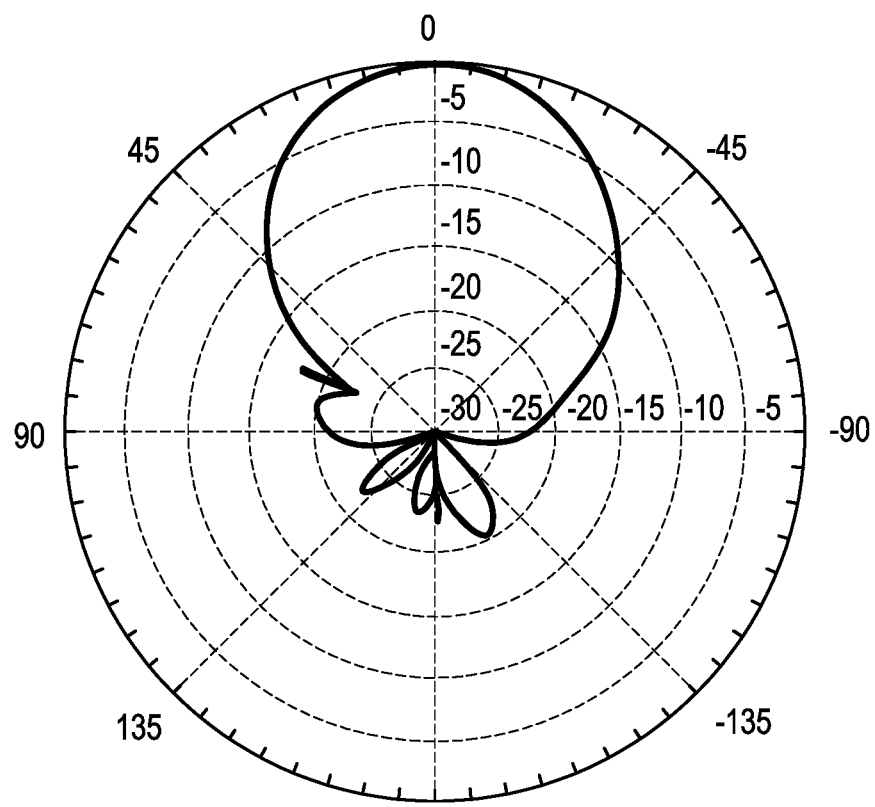

FIG. 5A to FIG. 5C depicts antenna gain-patterns of an analog beamformer used for array antenna at different output phase differences according to an embodiment of the disclosure. Please refer to FIG. 1 and FIG. 5A to FIG. 5C, wherein FIG. 5A shows an antenna gain-pattern of the radio-frequency signals $S_{RF1}$ to $S_{RFn}$ with an output phase difference of −60°, FIG. 5B shows an antenna gain-pattern of the radio-frequency signals $S_{RF1}$ to $S_{RFn}$ with an output phase difference of −30°, and FIG. 5C shows an antenna gain-pattern of the radio-frequency signals $S_{RF1}$ to $S_{RFn}$ with an output phase difference of 0°. As shown in FIG. 5A to FIG. 5C, the spatial resolutions of the field patterns are similar, but the antenna gain-pattern with the output phase difference of −60° generates a grating lobe effect.

Figure 6A:
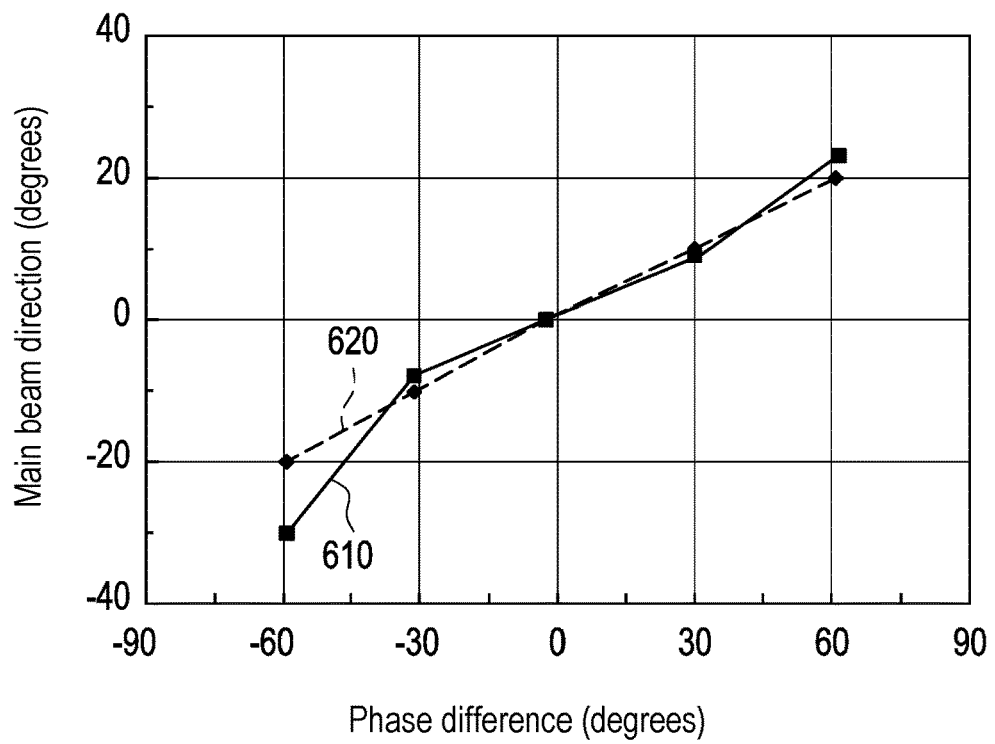
FIG. 6A illustrates the relationship between main lobe direction and output phase for a 1×2 array antenna according to an embodiment of the disclosure.
Figure 6B:
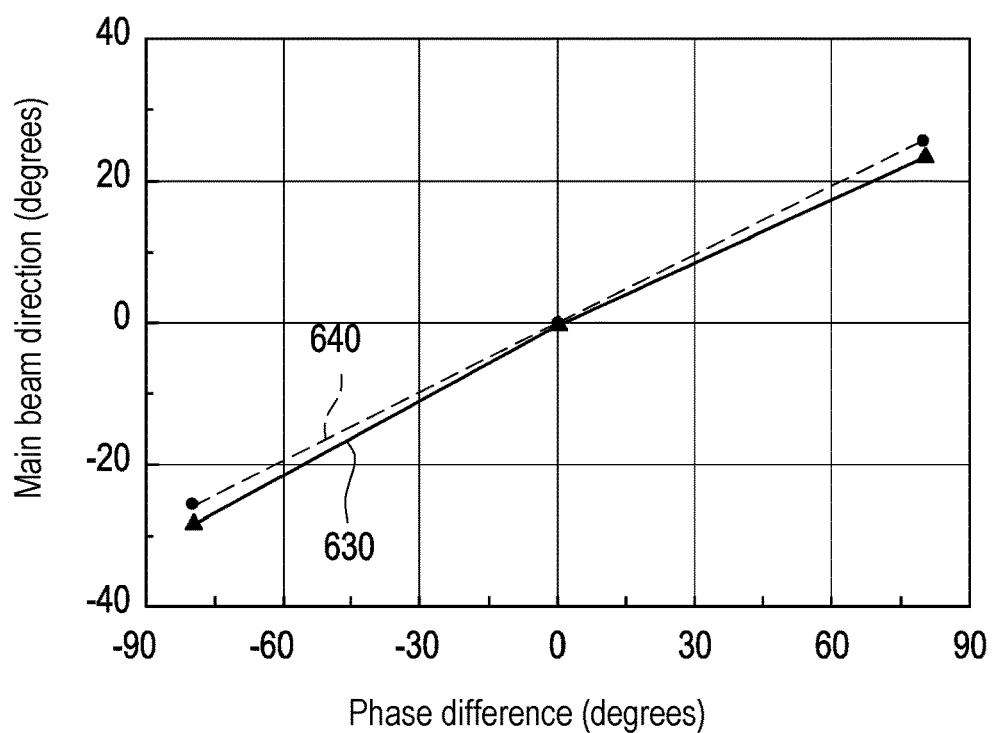
FIG. 6B is another case for a 1×3 array antenna.

FIG. 6A illustrates the relationship between main lobe direction and output phase for a 1×2 array antenna according to an embodiment of the disclosure. FIG. 6B is another case for a 1×3 array antenna. Please refer to FIG. 1 and FIG. 6A, a curve 610 is a measured relationship between a main beam direction of a radio-frequency signal emitted by a 1×2 array antenna and an output phase difference of the radio-frequency signal, and a curve 620 is a calculated relationship between the main beam direction of the radio-frequency signal emitted by the 1×2 array antenna and the output phase difference of the radio-frequency signal. As shown by the curves 610 and 620, in an interval of the output phase difference of 60° to −30°, the measured relationship substantially matches the calculated one.

On the other hand, please refer to FIG. 1 and FIG. 6B. A curve 630 is a measured relationship between a main beam direction of a radio-frequency signal emitted by a 1×3 array antenna and an output phase difference of the radio-frequency signal, and a curve 640 is a calculated relationship between the main beam direction of the radio-frequency signal emitted by the 1×3 array antenna and the output phase difference of the radio-frequency signal. As shown by the curves 630 and 640, the measured relationship substantially matches the calculated relationship.

Figure 7:
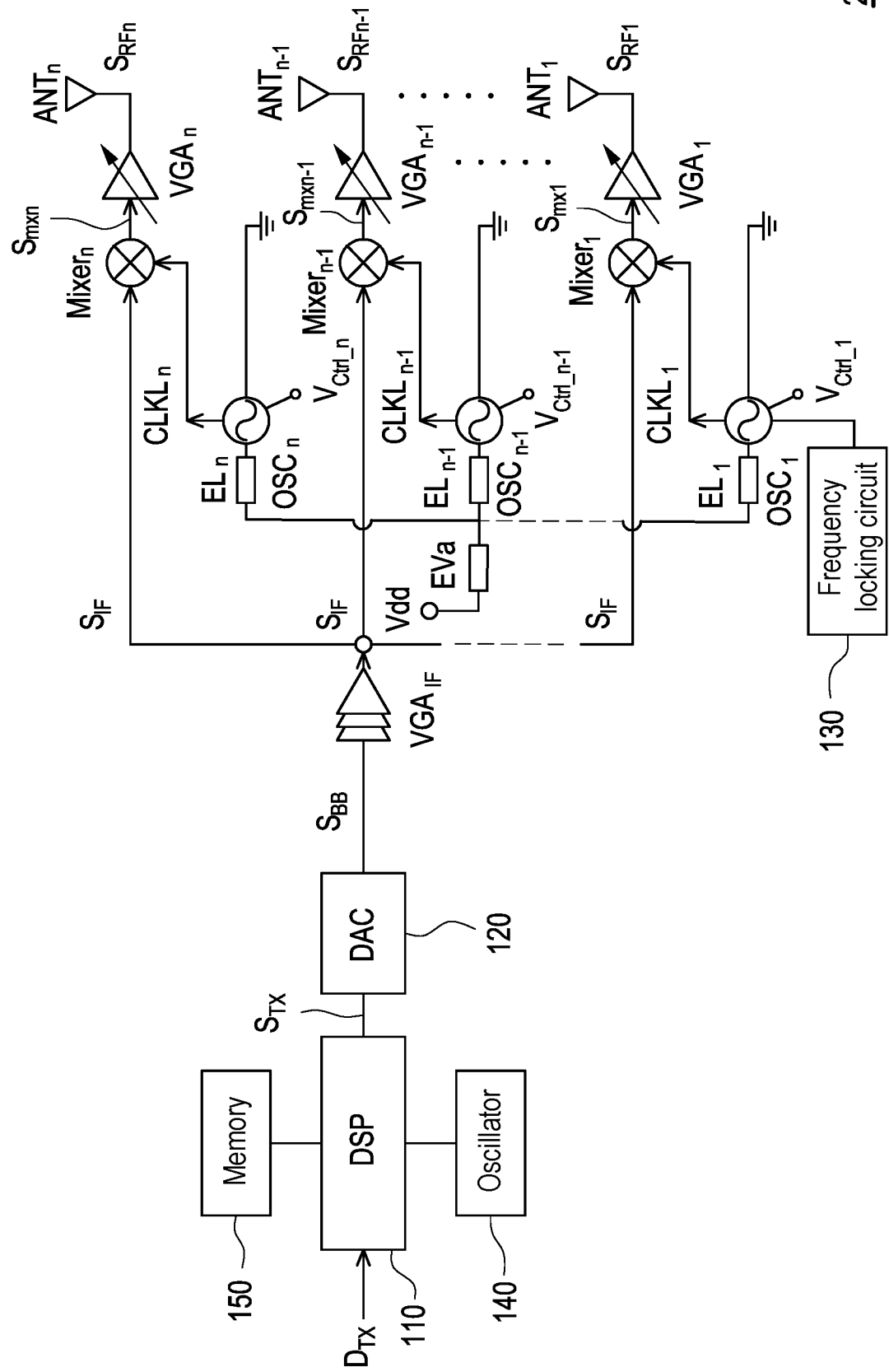
FIG. 7 is a schematic view of an analog beamformer used for array antenna in which connection by elements is only implemented at power supply terminals according to another embodiment of the disclosure.

FIG. 7 is a schematic view of a an analog beamformer used for array antenna according to another embodiment of the disclosure, which only implements connection by elements at power supply terminal. Please refer to FIG. 2 and FIG. 7. In the embodiment, an analog beamformer used for array antenna 200 is substantially the same as the analog beamformer used for array antenna 100, and the difference is that the analog beamformer used for array antenna 200 omits the first grounding-port-elements $ER_1$ to $ER_n$ and the second grounding-port-element EGa, that is, the grounding ports of the local oscillators $OSC_1$ to $OSC_n$ are directly connected to the external grounding terminal.

Figure 8:
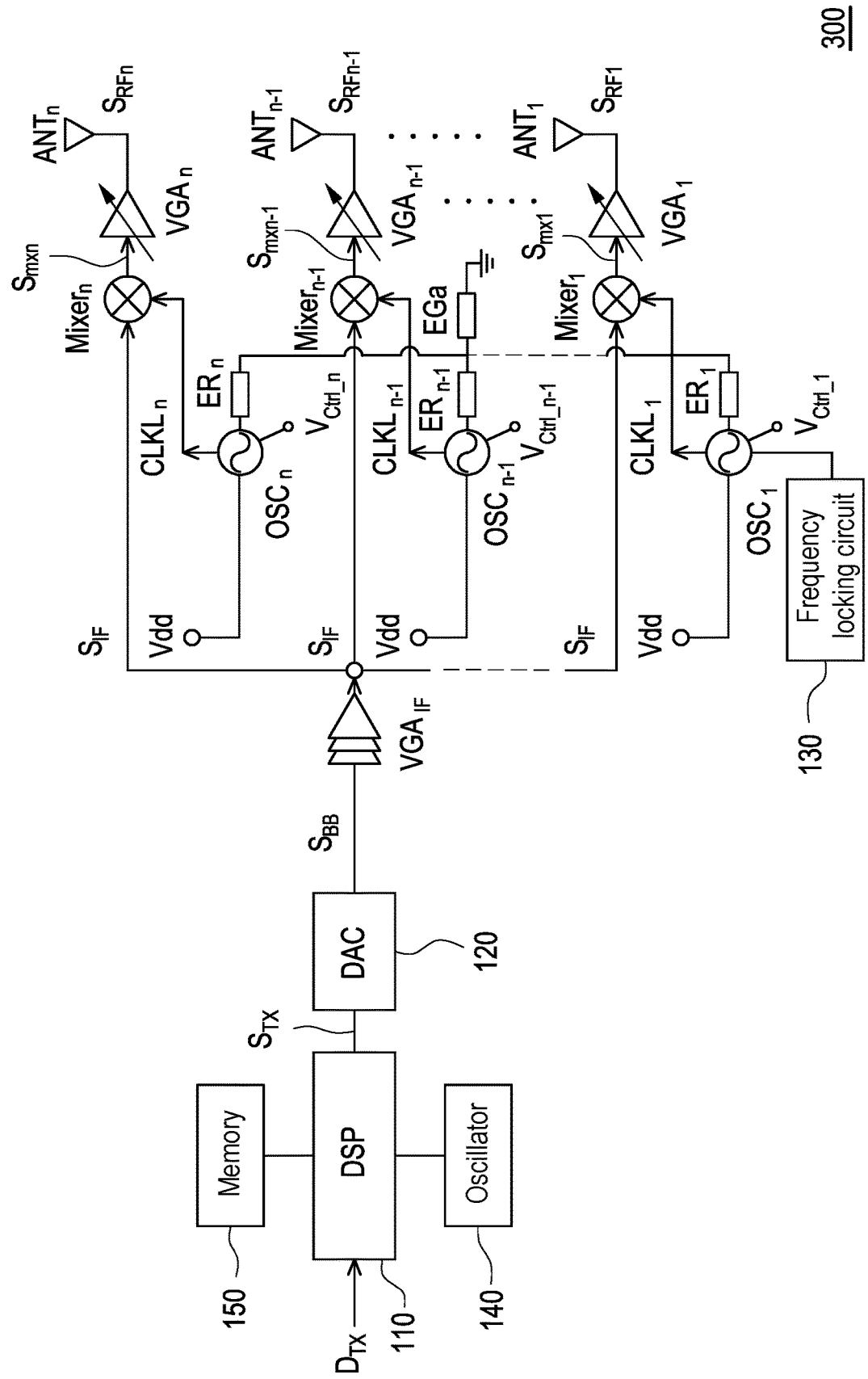
FIG. 8 is a schematic view of an analog beamformer used for array antenna in which connection by elements is only implemented at grounding terminals according to another embodiment of the disclosure.

FIG. 8 is a schematic view of an analog beamformer used for array antenna according to another embodiment of the disclosure, which only implements connection by elements at grounding ports. Please refer to FIG. 2 and FIG. 8. In the embodiment, an analog beamformer used for array antenna 300 is substantially the same as the analog beamformer used for array antenna 100, and the difference is that the analog beamformer used for array antenna 300 omits the first power-supply-elements $EL_1$ to $EL_n$ and the second power-supply-element Eva, that is, the DC-bias nodes of the local oscillators $OSC_1$ to $OSC_n$ receive the power supply voltage Vdd, respectively.

Figure 9A:
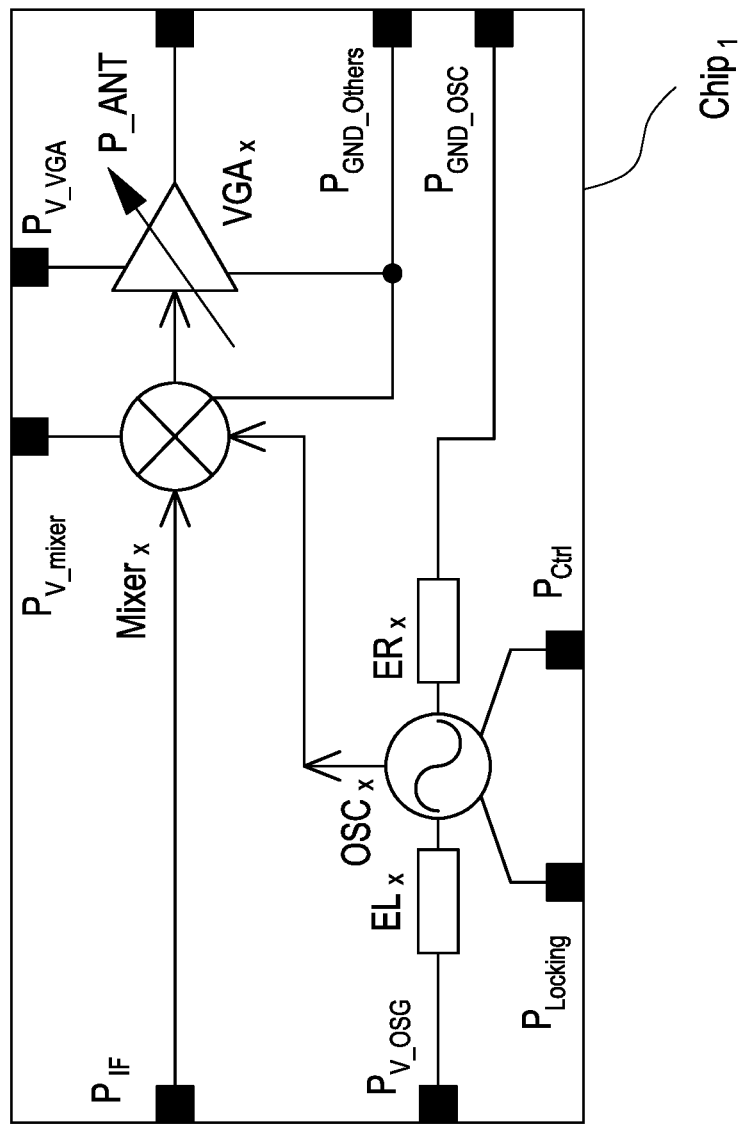
FIG. 9A is a function-block view of a single integrated circuit used in a beamformer, in which connecting nodes by elements are reserved to both power supplies and grounding ports according to an embodiment of the disclosure.

FIG. 9A shows the pin assignments of a single integrated circuit used for a beamformer in which connection by elements is applied to both DC-bias pin $P_{V\_OSG}$ and grounding pin $P_{GND\_OSG}$ according to an embodiment of the disclosure. Please refer to FIG. 2 and FIG. 9A, wherein the same or similar elements use the same or similar reference numerals. In the embodiment, each local oscillator $OSC_x$ and a coupled first power-supply-element $EL_x$, a coupled first grounding-port-element $ER_x$, a coupled mixer $Mixer_x$, and a corresponding radio-frequency amplifying circuit $VGA_x$ are encapsulated into a single integrated circuit $chip_1$, where x is an index number. The integrated circuit $chip_1$ has pins $P_{IF}$, $P_{V\_OSC}$, $P_{Locking}$, $P_{Ctrl}$, $P_{GND\_OSC}$, $P_{GND\_Others}$, $P\_ANT$, $P_{V\_VGA}$, and $P_{V\_mixer}$.

The pin $P_{IF}$ is coupled to an input end of the mixer $Mixer_x$. The first power-supply-element $EL_x$ is coupled between the pin $P_{V\_OSC}$ and the DC-bias node of the local oscillator $OSC_x$. The pin $P_{Locking}$ is coupled to a reference frequency end of the local oscillator $OSC_x$. The pin $P_{Ctrl}$ is coupled to a free-running-frequency control end of the local oscillator $OSC_x$. The first grounding-port-element $ER_x$ is coupled between the pin $P_{GND\_OSC}$ and a grounding port of the local oscillator $OSC_x$. The pin $P_{GND\_Others}$ is coupled to grounding ports of the mixer $Mixer_x$ and the radio-frequency amplifying circuit $VGA_x$. The pin P_ANT is coupled to an output end of the radio-frequency amplifying circuit $VGA_x$. The pin $P_{V\_VGA}$ is coupled to a power supply of the radio-frequency amplifying circuit $VGA_x$. The pin $P_{V\_mixer}$ is coupled to a power supply of the mixer $Mixer_x$.

Figure 9B:
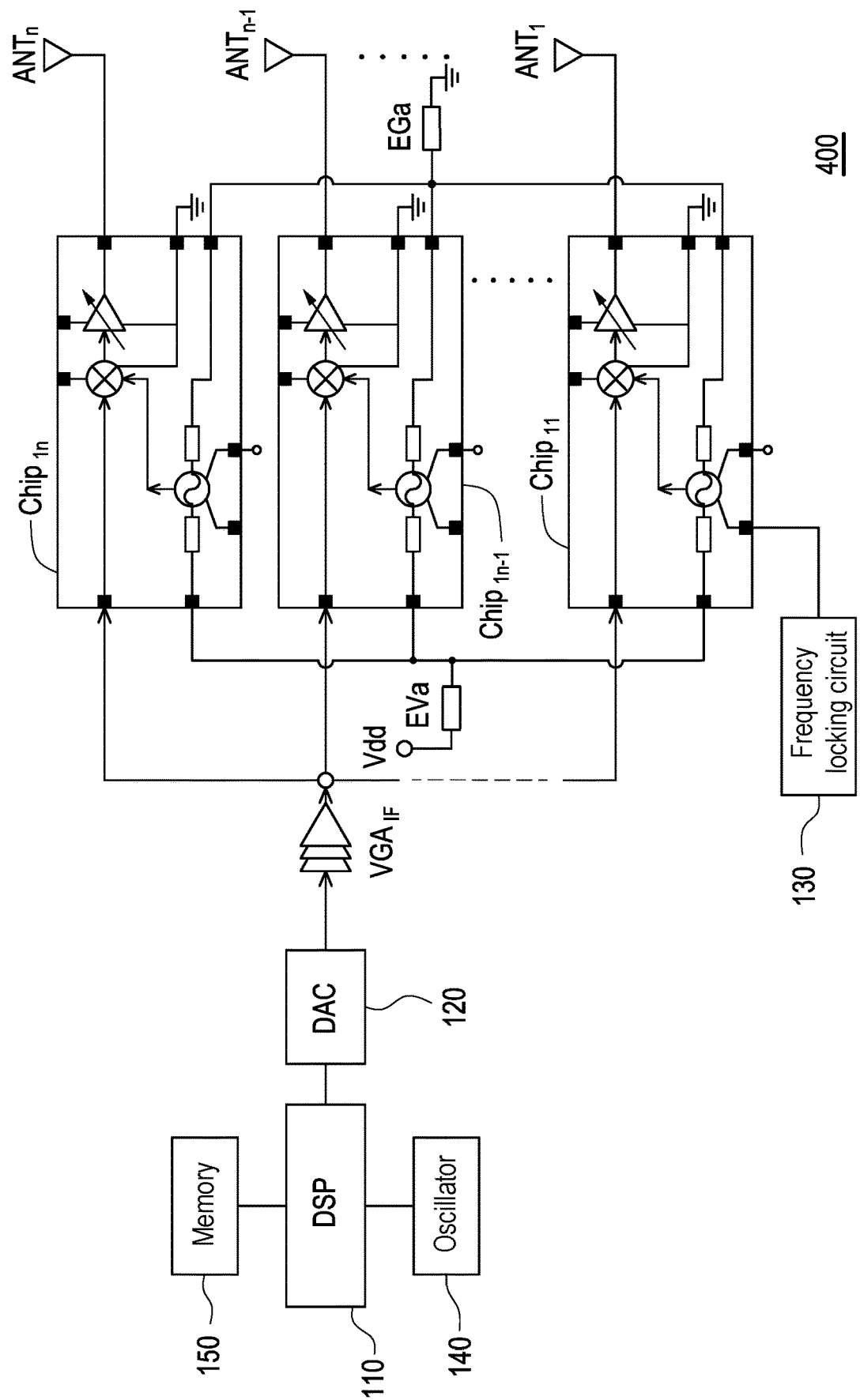
FIG. 9B is the implementation of an analog beamformer used for array antenna using multiple integrated circuits shown in FIG. 9A. Both of the power supplies and the grounding terminals are separately off-chip connected by elements according to an embodiment of the disclosure.

FIG. 9B shows the assembly of an analog beamformer used for array antenna using the single integrated circuit $chip_1$ shown in FIG. 9A according to an embodiment of the disclosure. Please refer to FIG. 2, FIG. 9A, and FIG. 9B. In the embodiment, the same or similar elements use the same or similar reference numerals. In an analog beamformer used for array antenna 400, integrated circuits $chip_{11}$ to $chip_{1n}$ are the same as the integrated circuit $chip_1$. The pins $P_{IF}$ of the integrated circuits $chip_{11}$ to $chip_{1n}$ are all coupled to an output end of the intermediate-frequency amplifying circuit $VGA_{IF}$. The pins $P_{V\_OSC}$ of the integrated circuits $chip_{11}$ to $chip_{1n}$ are all coupled to one end of the second power-supply-element EVa. The pin $P_{Locking}$ of only the integrated circuit $chip_{11}$ is coupled to the frequency locking circuit 130. The pins $P_{GND\_OSC}$ of the integrated circuits $chip_{11}$ to $chip_{1n}$ are all coupled to one end of the second grounding-port-element EGa. The pins $P_{GND\_Others}$ of the integrated circuits $chip_{11}$ to $chip_{1n}$ are independently connected to a different external grounding terminal. The pins P_ANT of the integrated circuits $chip_{11}$ to $chip_{1n}$ are respectively coupled to the antennas $ANT_1$ to $ANT_n$. In addition, although not shown in FIG. 9B, the $P_{V\_mixer}$ and $P_{V\_VGA}$ of the integrated circuits $chip_{11}$ to $chip_{1n}$ should receive corresponding power supply voltages to drive the mixer $Mixer_x$ and the radio-frequency amplifying circuit $VGA_x$ to operate.

Figure 10A:
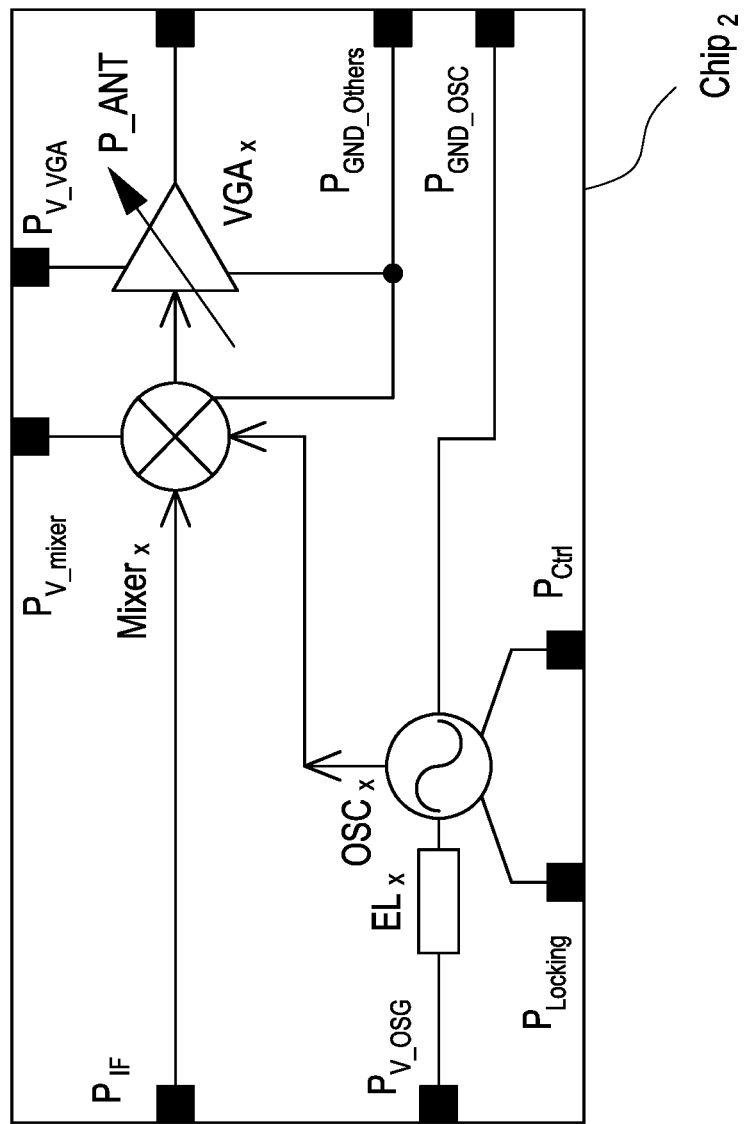
FIG. 10A is a function-block view of a single integrated circuit used in a beamformer in which connecting nodes by elements are reserved and only applied to power supply nodes according to an embodiment of the disclosure.

FIG. 10A shows the pin assignments of a single integrated circuit used for a beamformer in which connection by elements is only applied to DC-bias pin $P_{V\_OSG}$ according to an embodiment of the disclosure. Please refer to FIG. 9A and FIG. 10A. An integrated circuit $chip_2$ is substantially the same as the integrated circuit $chip_1$, and the difference is that the first grounding-port-element $ER_x$ is omitted in $chip_2$. That is, each local oscillator $OSC_x$ and the coupled first power-supply-element $EL_x$, the coupled mixer $Mixer_x$, and the corresponding radio-frequency amplifying circuit $VGA_x$ are encapsulated into the single integrated circuit $chip_2$. The pin $P_{GND\_OSC}$ directly plays a role of grounding port of the local oscillator $OSC_x$. It will be directly connected to an external independent grounding terminal.

Figure 10B:
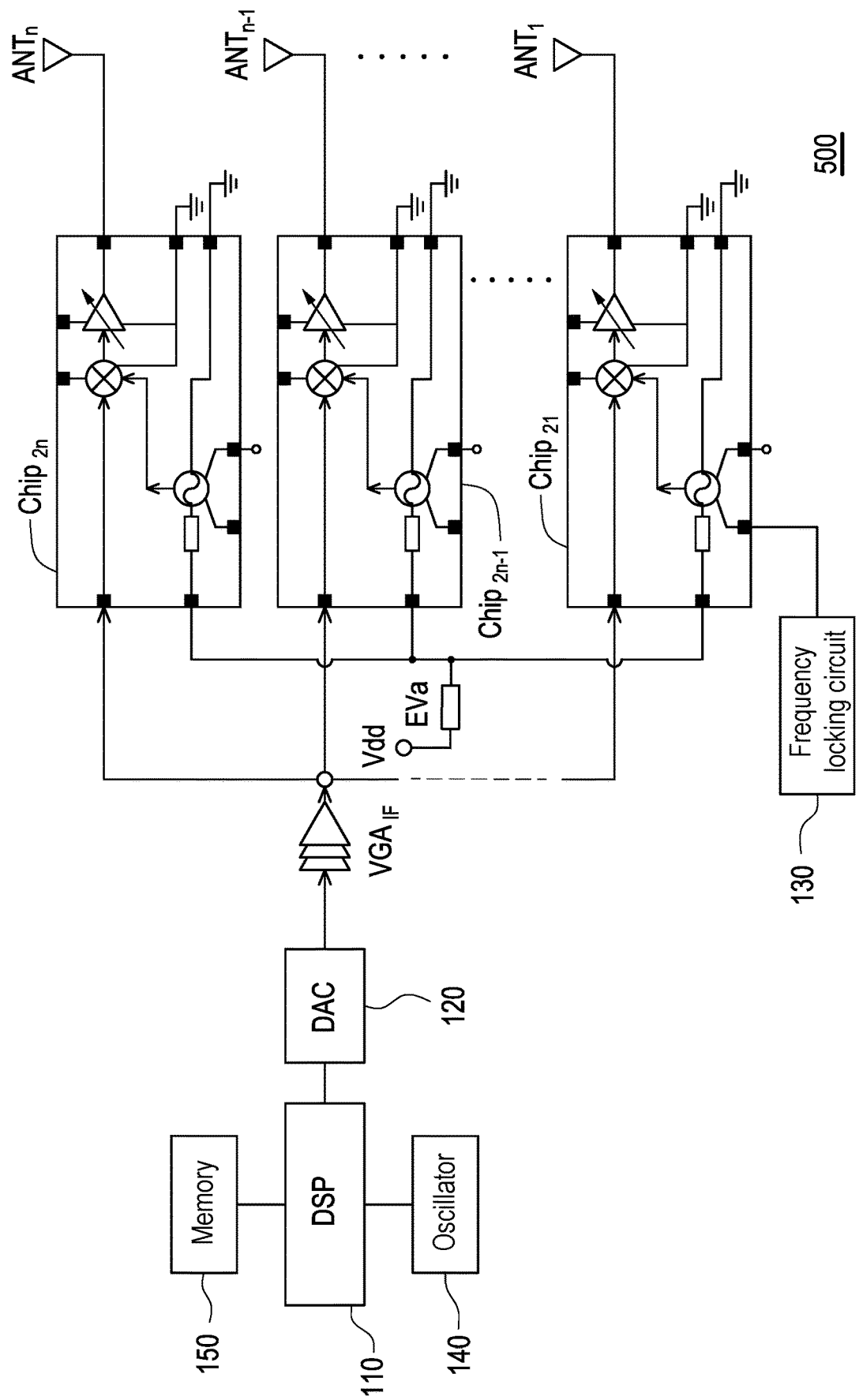
FIG. 10B is the implementation of an analog beamformer used for array antenna using multiple integrated circuits shown in FIG. 10A. In this case, only power supply terminals are off-chip connected by elements according to an embodiment of the disclosure.

FIG. 10B shows the assembly an analog beamformer used for array antenna system using the single integrated circuit $chip_2$ shown in FIG. 10A according to an embodiment of the disclosure. Please refer to FIG. 9B, FIG. 10A, and FIG. 10B. In the embodiment, the same or similar elements use the same or similar reference numerals. In an analog beamformer used for array antenna 500, integrated circuits $chip_{21}$ to $chip_{2n}$ are the same as the integrated circuit $chip_2$, and the difference between the analog beamformer used for array antenna 500 and the analog beamformer used for array antenna 400 is that the pins $P_{GND\_OSC}$ of the integrated circuits $chip_{21}$ to $chip_{2n}$ are directly connected to multiple external grounding terminals.

Figure 11A:
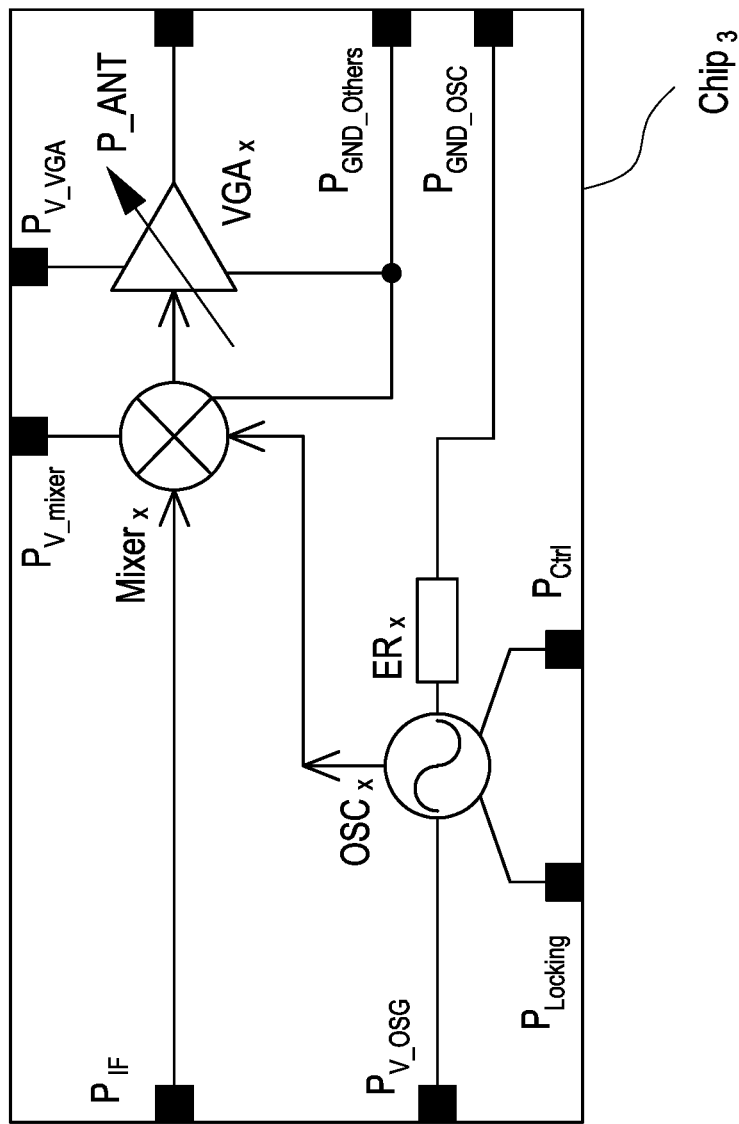
FIG. 11A is a function-block view of a single integrated circuit used in a beamformer in which connecting nodes by elements are reserved and only applied to grounding terminals according to an embodiment of the disclosure.

FIG. 11A shows the pin assignments of a single integrated circuit used for a beamformer in which connection by elements is only applied to grounding pin $P_{GND\_OSG}$ according to an embodiment of the disclosure. Please refer to FIG. 9A and FIG. 11A. An integrated circuit $chip_3$ is substantially the same as the integrated circuit $chip_1$, and the difference is that the first power-supply-element $EL_x$ is omitted. That is, each local oscillator $OSC_x$ and the coupled first grounding-port-element $ER_x$, the coupled mixer $Mixer_x$, and the corresponding radio-frequency amplifying circuit $VGA_x$ are encapsulated into the single integrated circuit $chip_3$. The pin $P_{V\_OSC}$ directly plays a role of the DC-bias nodes of the local oscillators. It will be directly connected to the external power supply.

Figure 11B:
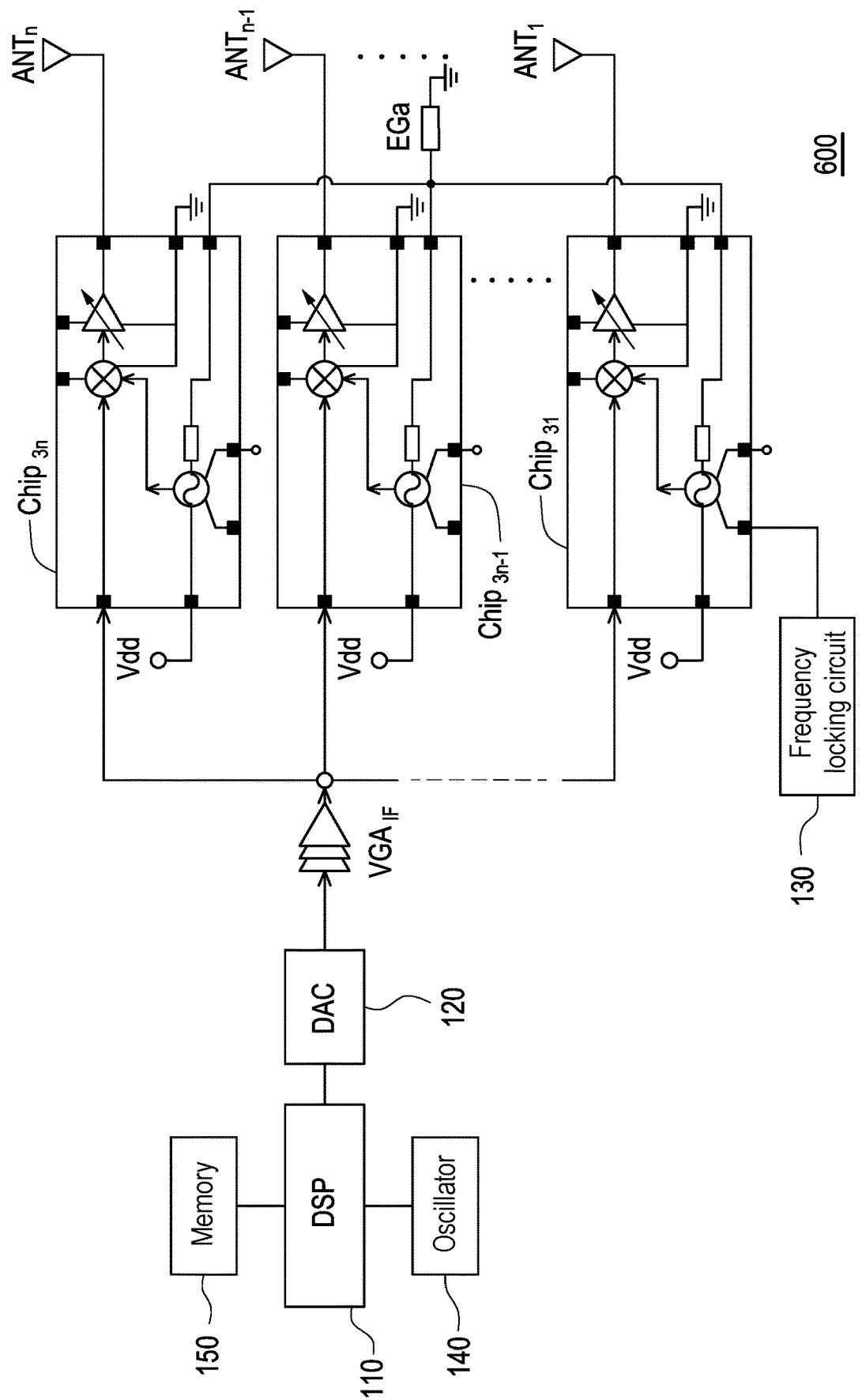
FIG. 11B is the implementation of an analog beamformer used for array antenna using the multiple integrated circuits shown in FIG. 11A. In this case, in which connecting by elements is only applied to the grounding terminals according to an embodiment of the disclosure.

FIG. 11B shows the assembly of an analog beamformer used for array antenna using the single integrated circuit $chip_3$ shown in FIG. 11A according to an embodiment of the disclosure. Please refer to FIG. 9B, FIG. 11A, and FIG. 11B. In the embodiment, the same or similar elements use the same or similar reference numerals. In an analog beamformer used for array antenna 600, integrated circuits $chip_{31}$ to $chip_{3n}$ are the same as the integrated circuit $chip_3$, and the difference between the analog beamformer used for array antenna 600 and the analog beamformer used for array antenna 400 is that the pins $P_{V\_OSC}$ of the integrated circuits $chip_{31}$ to $chip_{3n}$ directly connected to external power supply Vdd.

Figure 12:
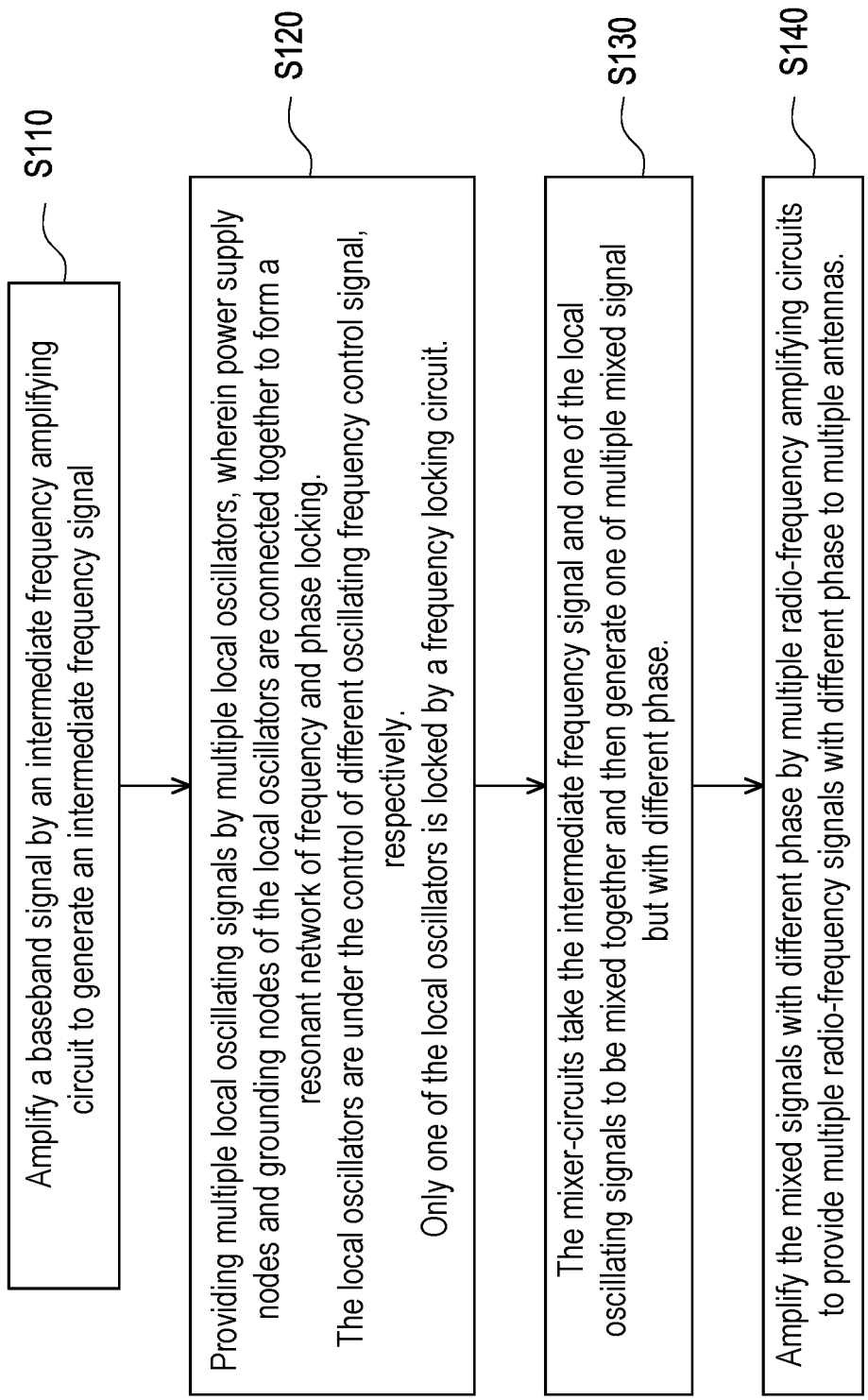
FIG. 12 is a flowchart of the operating method of an analog beamformer used for array antenna according to an embodiment of the disclosure.

FIG. 12 is a flowchart of the operating method of an analog beamformer used for array antenna according to an embodiment of the disclosure. Please refer to FIG. 12. In the embodiment, the operating method of the analog beamformer used for array antenna includes at least the following steps. In Step S110, a baseband signal is amplified by an intermediate-frequency amplifying circuit to generate an intermediate-frequency signal. In Step S120, multiple local-oscillating signals are provided by multiple local oscillators, wherein power supplies or grounding ports of the local oscillators are connected together to form a resonant network of frequency-and-phase-locking. The local oscillators are under the control of different oscillating-frequency-control signal, respectively. Only one of the local oscillators is locked by a frequency locking circuit such as phase lock loop. In Step S130, the intermediate-frequency signal and one of the local-oscillating signals are individually mixed by multiple mixers to generate one of multiple mixed signals with different phase. In Step S140, the mixed signals with different phase are amplified by multiple radio-frequency amplifying circuits to provide multiple radio-frequency signals with different phases to multiple antennas. The sequence of Steps S110, S120, S130, and S140 is for illustration, and the embodiment of the disclosure is not limited thereto. Also, for the details of Steps S110, S120, S130, and S140, reference may be made to the embodiments shown in FIG. 2, FIG. 3, FIG. 4A, FIG. 4B, FIG. 5A to FIG. 5C, FIG. 6A, FIG. 6B, FIG. 7, FIG. 8, FIG. 9A, FIG. 9B, FIG. 10A, FIG. 10B, FIG. 11A, and FIG. 11B, which will not be repeated here.

In summary, the analog beamformer used for array antenna and the operating method thereof according to the embodiments of the disclosure can achieve the same functionality like a phase shifter by connecting the local oscillators to form the resonant network of frequency-and-phase-locking. Since there is no disadvantage due to the use of the phase shifter, power loss can be reduced. In the meantime, the amplitude error and the phase error of the phase shifter can be effectively avoided, and then the estimation error of the reference symbol received power is minimized. Also, the local oscillators unlike the phase shifter, the occupied integrated-circuit area is smaller. It is good for the implementation and realization of the millimeter-wave beamforming circuit.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. An analog beamformer used for array antenna, comprising:
   an intermediate-frequency amplifying circuit, receiving a baseband signal to provide an intermediate-frequency signal;
   a plurality of local oscillators, wherein power supply nodes or grounding ports of the local oscillators are connected together to form a resonant network of frequency-and-phase-locking, and provide a plurality of local-oscillating signals, wherein the local oscillators receive a plurality of different oscillating-frequency-control signals;
   a plurality of mixers, individually receiving the intermediate-frequency signal and one of the local-oscillating signals, and the mixers providing a plurality of mixed signals with different phase;
   a plurality of radio-frequency amplifying circuits, receiving the mixed signals with different phase to provide a plurality of radio-frequency signals with different phase;
   a plurality of antennas, receiving the radio-frequency signals with different phase; and
   a frequency locking circuit, coupled to one of the local oscillators to lock a frequency of a local-oscillating signal of a coupled local oscillator.

2. The analog beamformer used for array antenna according to claim 1, wherein the local oscillators are coupled between a power supply voltage and a grounding voltage.

3. The analog beamformer used for array antenna according to claim 2, wherein the resonant network of frequency-and-phase-locking further comprises:
   a plurality of first power-supply-elements, individually coupled between a corresponding one of the local oscillators and one end of a second power-supply-element; and
   the second power-supply-element, having other end coupled to the power supply voltage.

4. The analog beamformer used for array antenna according to claim 3, wherein the first power-supply-elements and the second power-supply-element individually comprise one of a resistor, an inductor, a capacitor, a microstrip, a coaxial cable, and a waveguide.

5. The analog beamformer used for array antenna according to claim 3, wherein each of the local oscillators and a coupled first power-supply-element, a coupled mixer, and a corresponding radio-frequency amplifying circuit are encapsulated into a single integrated circuit.

6. The analog beamformer used for array antenna according to claim 2, wherein the resonant network of frequency-and-phase-locking further comprises:
   a plurality of first grounding-port-elements, individually coupled between a corresponding one of the local oscillators and one end of a second grounding-port-element; and
   the second grounding-port-element, having other end coupled to the grounding voltage.

7. The analog beamformer used for array antenna according to claim 6, wherein the first grounding-port-elements and the second grounding-port-element individually comprise one of a resistor, an inductor, a capacitor, a microstrip, a coaxial cable, and a waveguide.

8. The analog beamformer used for array antenna according to claim 6, wherein each of the local oscillators and a coupled first grounding-port-element, a coupled mixer, and a corresponding radio-frequency amplifying circuit are encapsulated into a single integrated circuit.

9. The analog beamformer used for array antenna according to claim 1, wherein the resonant network of frequency-and-phase-locking further comprises:
   a plurality of first power-supply-elements, individually coupled between a corresponding one of the local oscillators and one end of a second power-supply-element;
   the second power-supply-element, having other end coupled to a power supply voltage;
   a plurality of first grounding-port-elements, individually coupled between a corresponding one of the local oscillators and one end of the second grounding-port-element; and
   the second grounding-port-element, having one end coupled to a grounding voltage.

10. The analog beamformer used for array antenna according to claim 9, wherein the first power-supply-elements, the second power-supply-element, the first grounding-port-elements, and the second grounding-port-element individually comprise one of a resistor, an inductor, a capacitor, a microstrip, a coaxial cable, and a waveguide.

11. The analog beamformer used for array antenna according to claim 9, wherein each of the local oscillators and a coupled second power-supply-element, a coupled second grounding-port-element, a coupled mixer, and a corresponding radio-frequency amplifying circuit are encapsulated into a single integrated circuit.

12. The analog beamformer used for array antenna according to claim 1, further comprising:
    a processor, receiving data to be transmitted to generate a signal to be transmitted; and
    a digital to analog converter, converting the signal to be transmitted to generate the baseband signal.

13. An operating method of an analog beamformer used for array antenna, comprising:
    amplifying a baseband signal by an intermediate-frequency amplifying circuit to generate an intermediate-frequency signal;
    providing a plurality of local-oscillating signals by a plurality of local oscillators, wherein the local oscillators are connected by elements coupled to power supplies and/or grounding ports of the local oscillators to form a resonant network of frequency-and-phase-locking, the local oscillators receive a plurality of different oscillating-frequency-control signals, and the local-oscillating signal of one of the local oscillators is locked by a frequency locking circuit;
    individually mixing the intermediate-frequency signal and one of the local-oscillating signals by a plurality of mixers to generate one of a plurality of mixed signals with different phase; and
    amplifying the mixed signals with different phase by a plurality of radio-frequency amplifying circuits to provide a plurality of radio-frequency signals with different phases to a plurality of antennas.

14. The operating method according to claim 13, wherein the local oscillators are connected by a plurality of power-supply-elements between the local oscillators and a power supply voltage.

15. The operating method according to claim 14, wherein a frequency of only one of the local oscillators is locked, so that the local-oscillating signals of the local oscillators have a same consistent frequency.

16. The operating method according to claim 13, wherein the local oscillators are connected by a plurality of grounding-port-elements between the local oscillators and a grounding terminal.

17. The operating method according to claim 16, wherein a frequency of only one of the local oscillators is locked, so that the local-oscillating signals of the local oscillators have a same consistent frequency.

18. The operating method according to claim 13, wherein the local oscillators are connected by a plurality of power-supply-elements between the local oscillators and a power supply voltage, and a plurality of grounding-port-elements between the local oscillators and a grounding terminal.

19. The operating method according to claim 18, wherein a frequency of only one of the local oscillators is locked, so that the local-oscillating signals of the local oscillators have a same consistent frequency.

20. The operating method according to claim 19, further comprising: by changing the oscillating-frequency-control signals received by the local oscillators, the local-oscillating signals with the consistent frequency output by the local oscillators have different phases.

21. The operating method according to claim 13, further comprising:
   processing data to be transmitted by a processor to generate a signal to be transmitted; and
   converting the signal to be transmitted by a digital to analog converter to generate the baseband signal.

* * * * *